(12) United States Patent
Okada et al.

(10) Patent No.: US 9,326,435 B2
(45) Date of Patent: Apr. 26, 2016

(54) CHANGEOVER SUPPORT APPARATUS

(75) Inventors: Hiroyuki Okada, Kahoku (JP);
Mitsuhiro Iida, Kahoku (JP); Yoshie Miyashita, Kahoku (JP)

(73) Assignee: FUJITSU LIMITED, Kawasaki (JP)

( * ) Notice: Subject to any disclaimer, the term of this patent is extended or adjusted under 35 U.S.C. 154(b) by 253 days.

(21) Appl. No.: 13/212,820

(22) Filed: Aug. 18, 2011

(65) Prior Publication Data

US 2012/0048919 A1 Mar. 1, 2012

(30) Foreign Application Priority Data

Aug. 30, 2010 (JP) ................... 2010-192817

(51) Int. Cl.
*G06K 7/00* (2006.01)
*H05K 13/04* (2006.01)
*H05K 13/08* (2006.01)

(52) U.S. Cl.
CPC ........ *H05K 13/0452* (2013.01); *H05K 13/0417* (2013.01); *H05K 13/08* (2013.01)

(58) Field of Classification Search
USPC ............ 235/487, 492; 340/10.1, 572.1–572.9
See application file for complete search history.

(56) References Cited

U.S. PATENT DOCUMENTS

| 5,553,376 | A | 9/1996 | Solanki et al. |
| 7,089,074 | B2 | 8/2006 | Bollinger |
| 2003/0027363 | A1* | 2/2003 | Kodama ........................ 438/14 |
| 2006/0200261 | A1* | 9/2006 | Monette et al. ............... 700/108 |

FOREIGN PATENT DOCUMENTS

| DE | 19605489 A1 | 9/1996 |
| EP | 1239720 A2 | 9/2002 |
| JP | 5-8997 | 2/1993 |
| JP | 10-34459 | 2/1998 |
| JP | 10-209681 | 8/1998 |
| JP | 11-59833 | 3/1999 |
| JP | 2000-306062 | 11/2000 |
| JP | 2003-295927 | 10/2003 |
| JP | 2005-142586 | 6/2005 |
| JP | 2005-347351 | 12/2005 |
| JP | 2007-19320 | 1/2007 |

OTHER PUBLICATIONS

English translation of JP 2002-005608 to Sasaki.*
English translation of JP-2010-133232.*

(Continued)

*Primary Examiner* — Matthew Mikels
(74) *Attorney, Agent, or Firm* — Staas & Halsey LLP

(57) ABSTRACT

A mounting system includes a jig storage that stores an identifier of a component mounted on a circuit board with an identifier of a jig relative to which the component is provided, a component storage that stores an identifier of a circuit board with an identifier of a component to be mounted on the circuit board, a first identification unit that identifies a new component to be mounted on a new circuit board unit and a current component mounted on a circuit board unit currently being manufactured from the component storage when the new component is to be mounted, a second identification unit that compares the identified new component with the identified current component to identify a current component not included in the new component, and an emitter that causes light to be emitted via a light emitting element on a jig with the identified current component.

9 Claims, 19 Drawing Sheets

(56) References Cited

OTHER PUBLICATIONS

Japanese Office Action mailed Feb. 5, 2013 for corresponding Japanese Application No. 2010-192817.

Extended European Search Report issued Jun. 20, 2013 in corresponding European Patent Application No. 11178416.1.
Office Action of Chinese Patent Application No. 201110261647.6 dated Oct. 8, 2013.

* cited by examiner

FIG. 3

| TAPE WIDTH | COMPONENT PITCH | NUMBER OF LOADING POINTS TO BE OCCUPIED |
|---|---|---|
| 8 | 2 | 1 |
| 12 | 4 | 2 |
| 24 | 16 | 3 |

FIG. 4

| MOUNTER NUMBER | NUMBER OF CASSETTE JIGS TO BE LOADED (FRONT SIDE) | NUMBER OF CASSETTE JIGS TO BE LOADED (REAR SIDE) | NUMBER OF PALETTE JIGS TO BE LOADED (FRONT SIDE) | NUMBER OF PALETTE JIGS TO BE LOADED (REAR SIDE) | PALETTE JIG LOADING PITCH |
|---|---|---|---|---|---|
| 1 | 96 | 96 | 0 | 0 | 0 |
| 2 | 96 | 96 | 0 | 0 | 0 |
| 3 | 96 | 40 | 0 | 24 | 25 |

FIG. 5

| ORDER OF PLANS | UNIT NAME | UNIT FIGURE NUMBER | NUMBER OF UNITS TO BE MANUFACTURED | ARRANGEMENT OF COMPONENTS | TARGET COMPONENTS | GROUP | STATUS |
|---|---|---|---|---|---|---|---|
| 1 | UNIT-A | U0100 | 5 | OPTIONAL ARRAY | TAPE-PACKAGED | A | PLAN BEING PERFORMED |
| 2 | UNIT-B | U0200 | 100 | OPTIONAL ARRAY | TAPE-PACKAGED | A | PLAN TO BE PERFORMED |
| 3 | UNIT-C | U0300 | 7 | FIXED ARRAY | TAPE-PACKAGED + TRAY-PACKAGED | B | PLAN TO BE PERFORMED |
| 4 | UNIT-D | U0400 | 2 | FIXED ARRAY | TAPE-PACKAGED | C | PLAN TO BE PERFORMED |

FIG. 6

| UNIT NAME | UNIT FIGURE NUMBER | COMPONENT NAME | COMPONENT FIGURE NUMBER | LOADING POINT | NUMBER OF COMPONENTS TO BE MOUNTED |
|---|---|---|---|---|---|
| UNIT-A | U0100 | a | P1234 | 001 | 2 |
| UNIT-A | U0100 | b | P0023 | 002 | 1 |
| UNIT-A | U0100 | c | P0412 | 003 | 12 |
| UNIT-A | U0100 | d | P0411 | 004 | 8 |
| UNIT-A | U0100 | e | P3726 | 005 | 3 |
| UNIT-B | U0200 | b | P0023 | 001 | 2 |
| UNIT-B | U0200 | h | P0008 | 002 | 1 |
| UNIT-B | U0200 | i | P9222 | 003 | 4 |
| UNIT-B | U0200 | k | P3345 | 004 | 2 |

FIG. 7

| JIG ID | COMPONENT ID | COMPONENT NAME | COMPONENT FIGURE NUMBER | LOCATION |
|---|---|---|---|---|
| C0111 | T000012 | a | P1234 | MOUNTER |
| C8014 | T005689 | b | P0023 | MOUNTER |
| C2248 | T000421 | c | P0412 | MOUNTER |
| C0365 | T000033 | d | P0411 | MOUNTER |
| C0082 | T000712 | e | P3726 | MOUNTER |
| C1234 | T003983 | h | P0008 | STANDBY SPACE |
| C0011 | T000157 | i | P9222 | STANDBY SPACE |
| C5102 | T099201 | k | P3345 | STANDBY SPACE |

FIG. 8

| COMPONENT ID | COMPONENT NAME | COMPONENT FIGURE NUMBER | TAPE WIDTH | COMPONENT PITCH | COMPONENT HEIGHT | MOISTURE ABSORPTION MANAGEMENT TIME PERIOD | NON-STORAGE TIME PERIOD | NUMBER OF UNUSED COMPONENTS |
|---|---|---|---|---|---|---|---|---|
| T000012 | a | P1234 | 8 | 2 | 0.5 | 166:00:00 | 000:10:12 | 3500 |
| T005689 | b | P0023 | 8 | 4 | 0.7 | 166:00:00 | 054:01:00 | 2300 |
| T000421 | c | P0412 | 12 | 8 | 12.5 | - | 013:11:32 | 3200 |
| T000033 | d | P0411 | 8 | 2 | 0.6 | - | 098:00:54 | 10000 |

FIG. 9

| JIG ID | TAPE WIDTH | COMPONENT PITCH | RF TAG ID |
|---|---|---|---|
| C1234 | 8 | 2 | RF0001 |
| C0011 | 16 | 8 | RF0127 |
| C8014 | 8 | 4 | RF8120 |
| C5102 | 24 | 12 | RF3389 |
| C0111 | 8 | 4 | RF2625 |
| C2248 | 8 | 2 | RF0312 |
| C0365 | 8 | 4 | RF7001 |
| C0082 | 16 | 8 | RF0012 |

FIG. 10

| ANTENNA ID | LOCATION |
|---|---|
| ANT1 | STANDBY SPACE |
| ANT2 | STANDBY SPACE |
| ANT3 | MOUNTER |
| ANT4 | MOUNTER |

CHANGEOVER SUPPORT APPARATUS

CROSS-REFERENCE TO RELATED APPLICATIONS

This application is based upon and claims priority to prior Japanese Patent Application No. 2010-192817 filed on Aug. 30, 2010 in the Japan Patent Office, the entire contents of which are incorporated herein by reference.

FIELD

Embodiments disclosed herein relate to a changeover support apparatus, a changeover support method and a recording medium configured to store a changeover support program.

BACKGROUND

When mounting electronic components onto a printed circuit board unit, devices such as a mounter (mounting apparatus) and a reflow apparatus are used. Generally, in manufacturing line, a mounter mounts electronic components on a printed circuit board. After mounting the components on the printed circuit board, a reflow apparatus fixes the electronic components mounted on the printed circuit board using solder. In the manufacturing line, an amount of printed circuit board units that can be manufactured is determined depending on a mounter.

An example of processing by a mounter is described below. FIG. 19 illustrates a process in which a mounter mounts electronic components to a printed circuit board. As illustrated in FIG. 19, the mounter removes an electronic component 903 from a loading location 902 using a suction head 901 and mounts the electronic component 903 on a certain location of a printed circuit board 904. An operator loads electronic components to be mounted on a printed circuit board on the mounter before starting the manufacture of printed circuit board units. As illustrated in FIG. 19, two or more loading points in which an address is set is provided on the mounter, and the operator loads the electronic components on each of the loading points.

An operation in which an operator loads electronic components on a mounter by arranging the electronic components is described below. Description is provided for an example in which, using a mounter, a printed circuit board unit in which electronic components "a, b, c, d, e" are mounted thereon is manufactured in a plan A and, after that, a printed circuit board unit in which electronic components "h, i, b, k" are mounted is manufactured in a plan B. With reference to a list indicating electronic components to be used for plan A and plan B, the operator collects the electronic components stored in a warehouse and delivers the electronic components to a manufacturing site. The operator combines the delivered electronic component with a jig and stores the jig in a standby space because delivered electronic component has to be combined with a jig and for loading on the mounter. In addition, the operator repeats the operation to combine electronic components with a jig until the electronic components used for plan A and plan B are prepared, and stores the electronic components combined with the jig per plan unit.

After that, the operator loads electronic components for plan A on a mounter. In FIG. 19, the operator loads the electronic components on fixed loading points "1, 2, 3, 4, 5" of the mounter in order of electronic components "a, b, c, d, e", respectively. That is, the operator loads the electronic components "a" on a loading point having the address "1" and loads the electronic components "b" on a loading point having the address "2". In addition, the operator loads the electronic components "c" on an loading point having the address "3", loads the electronic components "d" on an loading point having the address "4", and loads the electronic components "e" on an loading point having the address "5". Such arrangement is referred to as a "fixed arrangement" in which a combination of a loading point on the mounter and electronic components is uniquely determined for each plan.

After that, when starting manufacturing of printed circuit board based on plan B, the operator performs changeover operations to load electronic components used for plan B on specific loading points on the mounter. The operator generally removes all electronic components for a first plan loaded on the mounter and loads electronic components for a second plan that are combined with a jig, on the mounter each time the changeover operations are performed.

In changeover operations, the same type of electronic components for two or more plans may be used in common. For example, as the electronic components "b" are used for plan A and plan B, an operator loads the electronic components "b" that have used for plan A on the mounter after manufacturing of printed circuit board based on plan A is finished because the electronic components "b" are also to be used for plan B. As described above, the electronic components "b" are used in common among two or more plans, thereby reducing workload for the operator and reducing inventories of electronic components.

In addition, a mounter may determine combination of a loading point and electronic components. In such arrangement, combination of a jig and a component is stored in a memory provided on the jig in advance, and a mounter determines the combination of a loading point and an electronic component by reading information stored in the memory when the jig is loaded on the mounter. In addition, the mounter mounts the determined electronic component to an exact position of each printed circuit board. In such arrangement, an operator may load an electronic component on a loading point in the mounter having any address in the mounter. Such arrangement is referred to as an "optional arrangement", in which a workload for an operator is reduced in comparison with the fixed arrangement.

When electronic components "a, b, c, d, e" are arranged in the optional arrangement, an operator may load each of the electronic components on each of the loading points "1, 2, 3, 4, 5" in order of "a, b, c, d, e", or may loads each of the electronic components on the loading points "1, 2, 3, 4, 5" in order of "b, a, d, e, c".

Related arts related to a mounting operation of electronic components are discussed in Japanese Laid-open Patent Publication No. 10-209681 and Japanese Laid-open Patent Publication No. 10-34459.

However, in the above-described way and others similar ways, problems existing including difficulty to perform changeover operations in which electronic components are loaded and removed on and from a mounting apparatus.

For example, when electronic components are arranged in the fixed arrangement, an operator selects electronic components with reference to the list and then loads the selected electronic components on a mounter. When electronic components to be loaded on a loading point having the address "1" are "a", the operator selects the electronic components "a" from the groups of electronic components that have already loaded on the mounter in a prior plan or from a standby space, and loads the electronic components "a" on the loading point having the address "1".

In addition, in the optional arrangement, an operator may loads a electronic component on any loading point of a mounter, and workload for an operator is reduced in comparison with the fixed arrangement. However, an operator needs to search electronic components to be reused each time the changeover operation is performed. For example, when the electronic component "b" is used in common among plan A and plan B, an operator has to search the electronic component "b" because it is difficult for the operator to identify the electronic component "b" based on the loading points of the electronic component. In addition, an operator needs to search electronic components to be removed from a mounter with reference to the list after a manufacturing based on plan A is finished even when the changeover operation is performed in the fixed arrangement or the optional arrangement.

When an operator loads electronic components on a mounter, the operator searches electronic components to be loaded from the electronic components stored in the standby space with reference to the list, one by one. In addition, the operator generally needs to search electronic components to be reused and electronic components to be removed from the mounter, from the electronic components loaded on the mounter with reference to the list after a plan currently being performed. It is difficult for an operator to perform loading and removal of the electronic components on and from the mounter because such changeover operations are complicated.

SUMMARY

According to an embodiment of the invention, changeover support apparatus includes a jig storage that stores an identifier of a component to be mounted on a printed circuit board unit in association with an identifier of a jig on which the component is provided, a component storage that stores an identifier of a printed circuit board unit in association with the identifier of the component to be mounted on the printed circuit board unit, a first identification unit that identifies an identifier of a new component to be mounted on a new printed circuit board unit and an identifier of a current component mounted on the printed circuit board unit currently being manufactured from the component storage when the new component is to be mounted on the new printed circuit board unit by the mounting apparatus, a second identification unit that compares the identifier of the new component with the identifier of the current component, and identifies a current component that is not included along with the new component, and a first light emitter that causes light to be emitted by a light emitting element provided on a jig in which the current component identified by the second identification unit is provided.

Objects and advantages of the invention will be realized and attained by means of the elements and combinations particularly pointed out in the claims. It is to be understood that both the foregoing general description and the following detailed description are exemplary and explanatory and are not restrictive of the invention, as claimed.

Additional aspects and/or advantages will be set forth in part in the description which follows and, in part, will be apparent from the description, or may be learned by practice of the invention.

BRIEF DESCRIPTION OF THE DRAWINGS

These and/or other aspects and advantages will become apparent and more readily appreciated from the following description of the embodiments, taken in conjunction with the accompanying drawings of which:

FIG. 3 illustrates an example of information stored in a cassette jig condition database (DB);

FIG. 4 illustrates an example of information stored in a mounter DB;

FIG. 5 illustrates an example of information stored in a plan DB;

FIG. 6 illustrates an example of information stored in a unit figure number DB;

FIG. 7 illustrates an example of information stored in a jig-component combination DB;

FIG. 8 illustrates an example of information stored in a component DB;

FIG. 9 illustrates an example of information stored in a jig-radio frequency (RF) tag combination DB;

FIG. 10 illustrates an example of information stored in an RF antenna DB;

DETAILED DESCRIPTION

Figure 1:
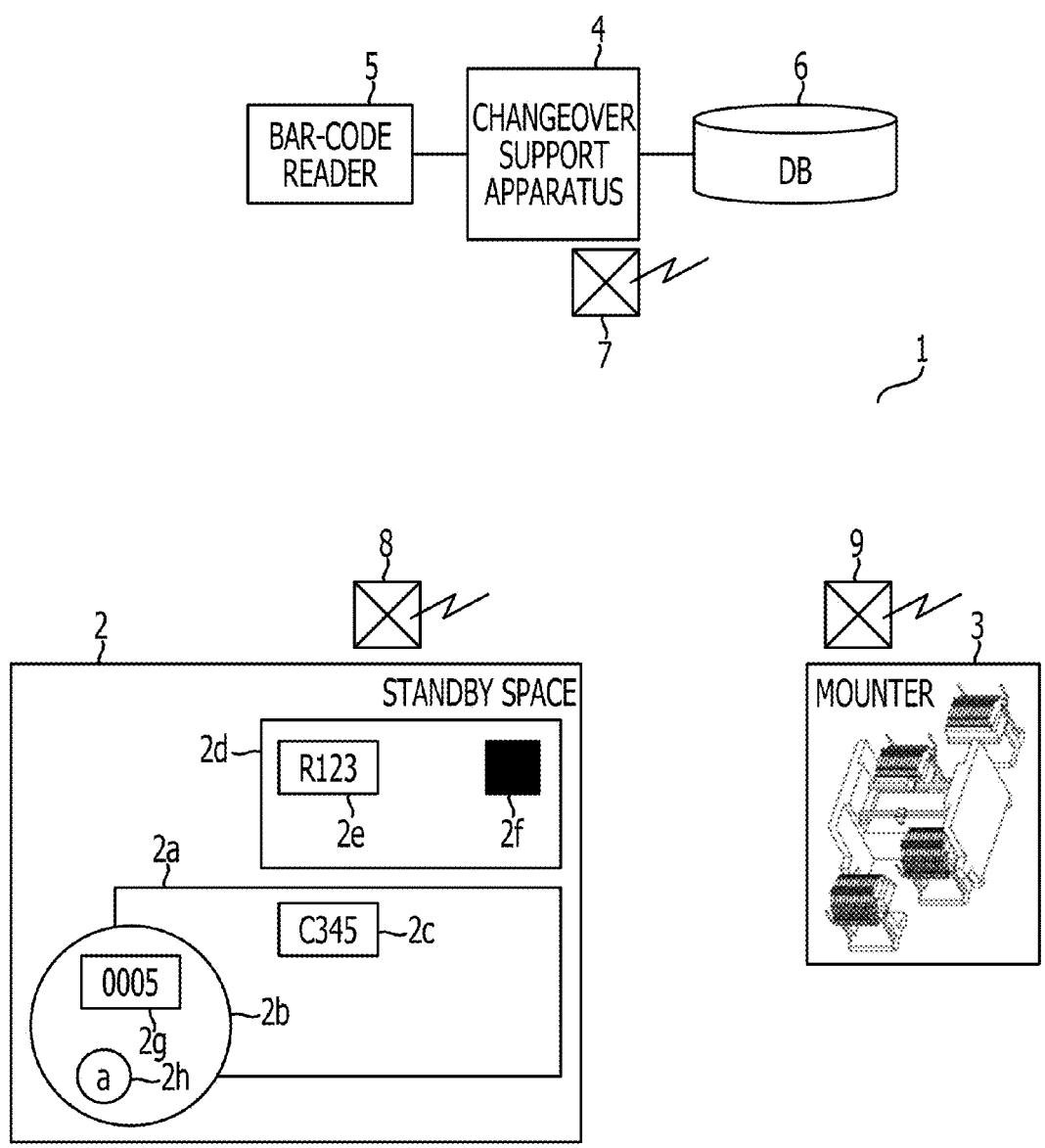
FIG. 1 illustrates an electronic component allocation system according to an embodiment.

Reference will now be made in detail to the embodiments, examples of which are illustrated in the accompanying drawings, wherein like reference numerals refer to the like elements throughout. The embodiments are described below to explain the present invention by referring to the figures.

An electronic component allocation system 1 including a changeover support apparatus 4 according to an embodiment is described with reference to FIG. 1. FIG. 1 illustrates a system configuration of the electronic component allocation system 1 according to an embodiment. The electronic component allocation system 1 illustrated in FIG. 1 includes a mounter 3, the changeover support apparatus 4, a bar-code reader 5, a DB 6, an RF antenna control box 7, a standby space RF antenna 8, and a mounter RF antenna 9.

The electronic component allocation system 1 in FIG. 1 is provided in a part of a manufacturing line for manufacturing printed circuit board units for example. In an embodiment, a manufacturing line using a Surface Mount Technology (SMT) (hereinafter referred to as "SMT line") is described as an example of the manufacturing line of printed circuit board units. The SMT line includes a printed circuit board supply apparatus, a screen printer, a mounter, a reflow apparatus, and a printed circuit board storage apparatus. The printed circuit board supply apparatus supplies printed circuit boards to the manufacturing line. The screen printer prints a solder paste to soldering points of printed circuit boards. The mounter mounts electronic components to printed circuit boards. The reflow apparatus solders the mounted electronic components to the printed circuit boards under heat treatment. The printed circuit board storage apparatus stores the completed printed circuit board units in a magazine.

The standby space 2 in illustrated FIG. 1 is a space to store electronic components combined with a jig. An operator collects electronic components stored in a management warehouse (not illustrated) and delivers the electronic components to a manufacturing site. After that, the operator combines the delivered electronic component with a jig and stores the combined electronic component and jig in the standby space 2. The operator repeats the operation to combine electronic component with a jig until electronic components for a certain plan are prepared. In addition, an electronic component that is not used for plans to be performed are removed from a jig by an operator and returned to the management warehouse. Hereinafter, the electronic components that are not used for plans to be performed and are removed from the corresponding jig are referred to as "components to be disassembled".

The electronic components stored in the standby space 2 may include tape-packaged electronic component that is winded around a reel and combined with a cassette jig, and tray-packaged electronic component that is combined with a palette jig. Each of the groups of electronic components has a component identification (ID) that allows the electronic component to be identified for each component shape and has a unique number as a bar-code, etc. In addition, each jig is also provided with a jig ID that allows the jig to be identified for each cassette jig or palette jig and has a unique number as a bar-code. While specific ways of identifying a component and jig is described herein, the present invention is not limited to any particular type of identifier and may including any data and information that uniquely identifies the component or jig.

A reel winded with a tape provided with electronic components equally spaced from each other is loaded on a cassette jig. When the tape is sent out from the reel intermittently, the electronic component provided to the tape is supplied to the mounter in order.

In addition, tray-packaged electronic components are provided to a palette jig, and the palette jig is loaded on the mounter 3 in a vertical direction. Tray-packaged electronic components provided on the palette jig loaded on the mounter is suctioned by a suction head.

In FIG. 1, tape-packaged electronic components 2b combined with a cassette jig 2a is stored in the standby space 2. The cassette jig 2a is provided with a cassette jig ID 2c that is an identifier to identify a jig. A number that is unique for each of the jigs is allocated to the cassette jig ID 2c. In the example illustrated in FIG. 1, "C345" is a cassette jig ID. In addition, for example, a bar-code seal in which the cassette jig ID 2c is recorded is attached to the cassette jig 2a.

An RF tag 2d is attached to the cassette jig 2a. The RF tag 2d stores an RF tag ID 2e that is an identifier to identify an RF tag. A number that is unique for each of the RF tags is allocated to the RF tag ID 2e. In the example illustrated in FIG. 2, "R123" is an RF tag ID.

The RF tag 2d includes a Light Emitting Diode (LED) 2f and causes the LED 2f to emit light when a command is received through the standby space RF antenna 8 and an electric power is supplied. In addition, when the RF tag 2d receives a command through the standby space RF antenna 8, the RF tag 2d transmits the RF tag ID 2e to the standby space RF antenna 8. For example, an LED tag such as RW2-TMD23 provided by Yoshikawa RF system Co., Ltd can be used as such RF tag.

The standby space stores a component ID 2g that is an identifier to identify the tape-packaged electronic components 2b. A number that is unique for each of the electronic components is allocated to the component ID 2g. In the example illustrated in FIG. 2, "0005" is a component ID. In addition, a component figure number 2h is allocated to the tape-packaged electronic components 2b. In the example illustrated in FIG. 2, "a" is a component figure number.

Moisture absorption management components in which moisture absorption management of the electronic components is required are also included in electronic components. A certain time period for determining timing between taking out moisture absorption management components to an environment at ordinary temperature and ordinary humidity and putting the moisture absorption management components into a reflow furnace is set for the moisture absorption management component. When the certain time period set for the moisture absorption management components elapses, the moisture absorption management components are reused after the moisture absorption management components are heat treated a certain temperature for a certain time period and internal moisture of the moisture absorption management components is removed. Thus, moisture absorption management components are stored in a hermetically-closed storage in which humidity is managed. The standby space 2 is provided with a moisture absorption storage to store the moisture absorption management components.

An operator loads electronic components stored in the standby space 2 on a mounter 3. The mounter 3 mounts electronic components to a printed circuit board by suctioning or picking the electronic component form a reel loaded on a cassette jig or a tray placed flatly on a palette jig.

The changeover support apparatus 4 is communicatively coupled to the bar-code reader 5, the DB 6, and the RF antenna control box 7 through a Local Area Network (LAN) or radio waves. When electronic components are provided to a jig, the bar-code reader 5 reads a bar-code attached to the electronic component and the jig, and creates information in which the electronic components is associated with a jig one-on-one.

DB 6 stores an identifier to identify a component to be mounted on a printed circuit board unit in association with an identifier to identify a jig provided with the component. In addition, DB 6 stores an identifier to identify a printed circuit board unit in association with the identifier to identify a component to be mounted on the printed circuit board unit.

When a new printed circuit board unit is manufactured, the changeover support apparatus 4 identifies an identifier of a new component to be mounted on the new printed circuit board unit and an identifier of a current component mounted on printed circuit board unit currently being manufactured. The changeover support apparatus 4 compares the identifier of the new components with the identifier of the current components and identifies any current component that is not included in the new components. The changeover support apparatus 4 identifies a jig provided with the identified current component and causes a light-emitting element of the identified jig to emit light. As a result, when the current component that is not included in the new components, that is, the current component that is not to be mounted on the new printed circuit board unit is removed from a mounter, an operator may confirm current and new components without complicated operations.

The RF antenna control box 7 is communicatively coupled to each of the standby space RF antenna 8 located in the standby space 2 and the mounter RF antenna 9 located near the mounter 3, through radio waves. The RF antenna control box 7 transmits a command to the standby space RF antenna 8. When the standby space RF antenna 8 receives the command from the RF antenna control box 7, the standby space RF antenna 8 causes the LED 2f of the RF tag 2d attached to the group of electronic components 2b in the standby space 2 to emit light. In addition, the standby space RF antenna 8 reads the RF tag ID 2e attached to the group of electronic components 2b in the standby space 2 and transmits the information of the RF tag ID 2e to the RF antenna control box 7.

The RF antenna control box 7 transmits a command to the mounter RF antenna 9. When the mounter RF antenna 9 receives the command from the RF antenna control box 7, the mounter RF antenna 9 causes the LED 2f of the RF tag 2d attached to the electronic components in the mounter 3 to emit light. In addition, the mounter RF antenna 9 reads the RF tag ID 2e attached to the electronic components in the mounter 3 and transmits the information of the RF tag ID 2e to the RF antenna control box 7.

Figure 2:
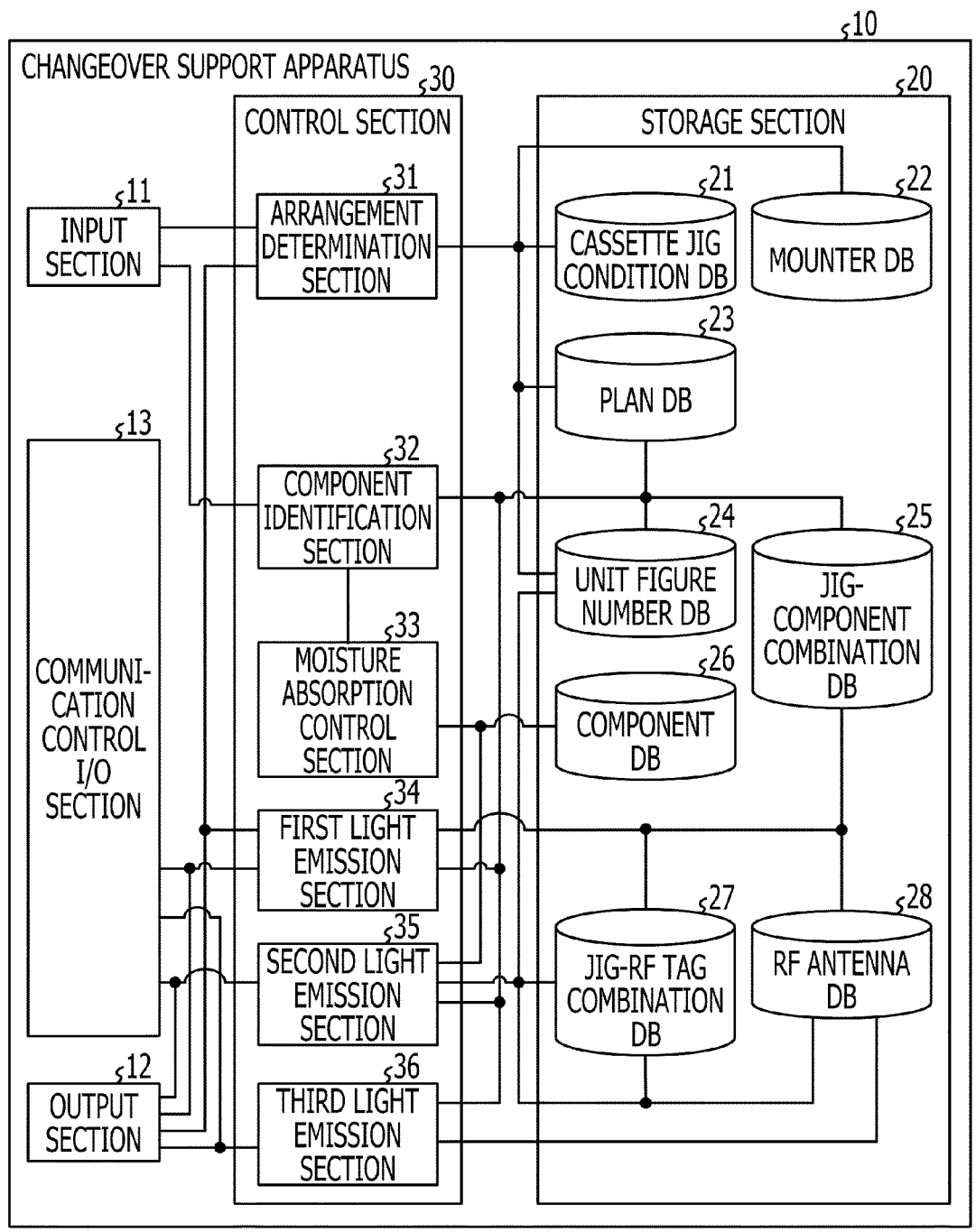
FIG. 2 illustrates a changeover support apparatus according to an embodiment.

FIG. 2 illustrates a changeover support apparatus 10 according to an embodiment. The changeover support apparatus 10 according to an embodiment includes an input section 11, an output section 12, a communication control interface (I/F) 13, a storage 20 and a controller 30.

For example, the input section 11 may be a keyboard, a mouse, a touch-screen unit, a bar-code reader, etc. The input section 11 accepts an instruction such as a manufacturing schedule, removal processing, and loading processing that an operator inputs, and transmits the inputted instruction to the controller 30. For example, the output section 12 may be a monitor device, a display device, a touch-screen unit, etc. The output section 12 outputs information received from the controller 30 such as a loading point of a group of electronic components and a time period when moisture absorption management components are not stored in the moisture absorption storage (hereinafter, referred to as "non-storage time period").

The communication control I/F 13 is an interface unit including at least one communication port and controls communication of information between the changeover support apparatus and another device. The communication control I/F 13 includes an RF antenna control box.

The RF antenna control box receives a command from a first light emission section 34 and transmits the received command to an RF antenna located near the mounter. As a result, the RF antenna located near the mounter transmits the command to an RF tag attached to a group of electronic components loaded on the mounter and causes an LED included in the RF tag to emit light.

The RF antenna control box receives a command from a second light emission section 35 and transmits the receive command to an RF antenna located in the standby space. As a result, the RF antenna located in the standby space transmits the command to an RF tag attached to a group of electronic components in the standby space and causes an LED included in the RF tag to emit light.

The RF antenna control box receives a command from a third light emission section 36 and transmits the received command to an RF antenna located in the standby space. As a result, the RF antenna located in the standby space transmits the command to an RF tag attached to a group of electronic components in the standby space and causes an LED included in the RF tag to emit light.

The RF antenna control box receives an RF tag ID from the RF antenna located near the mounter and in the standby space 2. In addition, the RF antenna control box associates the receive RF tag ID with an antenna ID indicating a source from which the RF tag ID is received and transmits the receive RF tag ID and the antenna ID to the first light emission section 34. The first light emission section 34 identifies a location of the RF tag ID from the antenna ID received from the RF antenna control box. In addition, the first light emission section 34 identifies a corresponding jig ID from the RF tag ID and then identifies a location of the identified jig ID. In addition, the first light emission section 34 stores the identified locations in the jig-component combination DB 25. The jig-component combination DB 25 may update and store a location of the electronic components as latest information.

The storage 20 stores a cassette jig condition DB 21, a mounter DB 22, a plan DB 23, a unit figure number DB 24, a jig-component combination DB 25, a component DB 26, a jig-RF tag combination DB 27, and an RF antenna DB 28. For example, the storage 20 may be a storage device such as a semiconductor memory element and a hard disk.

The cassette jig condition DB 21 stores the number of loading points to be occupied by cassette jig based on tape width and a component pitch of a cassette jig. FIG. 3 illustrates an example of information stored in the cassette jig condition DB 21. For example, as illustrated in FIG. 3, the cassette jig condition DB 21 stores "8, 2, 1", "12, 4, 2", and "24, 16, 3" as "tape width, component pitch, number of loading points to be occupied", respectively.

The "tape width" indicates tape width of a cassette jig. In the example of FIG. 3, "8", "12", "24", etc., correspond to the "tape width". The "component pitch" indicates pitch between packaged electronic components on the tape. In the example of FIG. 3, "2", "4", "16", etc., correspond to the "component pitch". The "number of loading points to be occupied" indicates the number of loading points to be occupied on a mounter when cassette jigs are loaded on the mounter. In the example of FIG. 3, "1", "2", "3", etc., correspond to the number of loading points to be occupied.

In the example of FIG. 3, the cassette jig condition DB 21 indicates that one loading point is occupied when a cassette jig has 8 mm of tape width and 2 mm of component pitch. In addition, the cassette jig condition DB 21 indicates that two loading points are occupied when a cassette jig has 12 mm of tape width and 4 mm of component pitch, and indicates that three loading points are occupied when a cassette jig has 24 mm of tape width and 16 mm of component pitch.

The mounter DB 22 stores the number of loading points of cassette jigs and palette jigs for each mounter. FIG. 4 illustrates an example of information stored in the mounter DB 22. For example, as illustrated in FIG. 4, the mounter DB 22 stores "1, 96, 96, 0, 0, 0" as "mounter number, number of cassette jigs to be loaded (front side), number of cassette jigs to be loaded (rear side), number of palette jigs to be loaded (front side), number of palette jigs to be loaded (rear side), and palette jig loading pitch". In addition, the mounter DB 22 stores, "2, 96, 96, 0, 0, 0", "3, 96, 40, 0, 24, 25" as "mounter number, number of cassette jigs to be loaded (front side), number of cassette jigs to be loaded (rear side), number of palette jigs to be loaded (front side), number of palette jigs to be loaded (rear side), palette jig loading pitch", respectively.

The "mounter number" indicates an identifier to identify a mounter and stores values such as the "1", "2", and "3". The "number of cassette jigs to be loaded (front side)" indicates the number of cassette jigs that may be loaded on a front part of the mounter and stores a value of "96", etc. The "number of cassette jigs to be loaded (rear side)" indicates the number of cassette jigs that may be loaded on a rear part of the mounter and stores values such as the "40" and "96". The "number of palette jigs to be loaded (front side)" indicates the number of palette jigs that may be loaded on the front part of the mounter and stores a value of "0", etc. The "number of palette jigs to be loaded (rear side)" indicates the number of palette jigs that may be loaded on the rear part of the mounter and stores values such as the "0" and "24". The "palette jig loading pitch" indicates loading pitch between the palette jigs and stores values such as the "0" and "25".

In the example of FIG. 4, in a mounter having the mounter number "1", 96 cassette jigs may be loaded on a front part of the mounter, and 96 cassette jigs 96 may be loaded on a rear part of the mounter. In addition, in a mounter having the mounter number "2", 96 cassette jigs may be loaded on a front part of the mounter, and 96 cassette jigs may be loaded on a rear part of the mounter. In addition, in a mounter having the mounter number "3", 96 cassette jigs may be loaded on a front part of the mounter, 40 cassette jigs may be loaded on a rear part of the mounter, and 24 palette jigs may be loaded on a rear surface of the mounter.

The plan DB 23 stores an identifier to identify units in which manufacture is planned, an identifier to identify electronic components to be mounted on the units in which manufacture is planned, an arrangement for electronic components, order of plans to be performed, and a state of processing, etc. FIG. 5 illustrates an example of information stored in the plan DB 23. For example, as illustrated in FIG. 5, the plan DB 23 stores "1, UNIT-A, U0100, 5, optional arrangement, tape-packaged, A, plan being performed" as "order of plans, unit name, unit figure number, number of units to be manufactured, arrangement of components, target components, group, state". In addition, the plan DB 23 stores "2, UNIT-B, U0200, 100, optional arrangement, tape-packaged, A, plan to be performed", "3, UNIT-C, U0300, 7, fixed arrangement, tape-packaged+tray-packaged, B, plan to be performed", "4, UNIT-D, U0400, 2, fixed arrangement, tape-packaged, C, plan to be performed" as "order of plans, unit name, unit figure number, number of units to be manufactured, arrangement of components, target components, group, state".

The "order of plans" indicates the order of printed circuit board units to be manufactured and stores values such as the "1", "2", "3" and "4". The "unit name" indicates an identifier to identify printed circuit board units to be manufactured and stores names such as the "UNIT-A", "UNIT-B", "UNIT-C", and "UNIT-D". The "unit figure number" indicates an identifier of a unit figure number to identify electronic components to be mounted on printed circuit board units and stores numbers such as the "U0100", "U0200", "U0300", and "U0400". The "number of units to be manufactured" indicates the number of printed circuit board units to be manufactured and stores values such as the "5", "100", "7", and "2". The "arrangement of components" indicates whether an arrangement for electronic components set for each manufacturing schedule is the fixed arrangement or the optional arrangement and stores information such as the "fixed arrangement" and "optional arrangement". The "target component" indicates whether electronic components to be mounted on printed circuit board units are tape-packaged electronic components or tray-packaged electronic components and stores information such as the "tape-packaged" and "tape-packaged+tray-packaged". The "group" indicates the name of a manufacturing schedule group in which changeover operations are performed while the same changeover operations are also performed for other types of units, and stores information such as the "A", "B", and "C".

The "state" indicates a state of processing in a manufacturing schedule and stores information such as the "plan being performed" and "plan to be performed".

In the example of FIG. 5, it is indicated that five of the "UNIT-A" having the unit figure number "U0100" are being manufactured as a first plan. In the manufacture of the "UNIT-A", it is indicated that tape-packaged electronic components are loaded on the mounter in the optional arrangement, and changeover operations are performed while the same changeover operations are also performed for other types of units belonging the group "A". Furthermore, in the example of FIG. 5, it is indicated that 100 of the "UNIT-B" having the unit figure number "U0200" are to be manufactured as a second plan. In the manufacture of the "UNIT-B", it is indicated that tape-packaged electronic components are to be loaded on the mounter in the optional arrangement, and changeover operations are performed while the same changeover operations are also performed for other types of units belonging the group "A".

Furthermore, in the example of FIG. 5, it is indicated that seven of the "UNIT-C" having the unit figure number "U0300" are to be manufactured as a third plan. In the manufacture of the "UNIT-C", it is indicated that tape-packaged electronic components and tray-packaged electronic components are to be loaded on the mounter in the fixed arrangement, and the "UNIT-C" belongs to the group "B". Furthermore, in the example of FIG. 5, it is indicated that two of the "UNIT-D" having the unit figure number "U0400" are to be manufactured as a forth plan. In the manufacture of the "UNIT-D", it is indicated that tape-packaged electronic components are to be loaded on the mounter in the fixed arrangement, and the "UNIT-D" belongs to the group "C".

The unit figure number DB 24 stores information of electronic components to be mounted on printed circuit board units. FIG. 6 illustrates an example of information stored in the unit figure number DB 24. As illustrated in FIG. 6, the unit figure number DB 24 stores "UNIT-A, U0100, a, P1234, 001, 2", "UNIT-A, U0100, b, P0023, 002, 1", "UNIT-A, U0100, c, P0412, 003, 12" as "unit name, unit figure number, component name, component figure number, loading point, number of components to be mounted". In addition, the unit figure number DB 24 stores "UNIT-A, U0100, d, P0411, 004, 8", "UNIT-A, U0100, e, P3726, 005, 3" as "unit name, unit figure number, component name, component figure number, loading point, number of components to be mounted".

Since the "unit name" and the "unit figure number" are similar to the information stored in the plan DB 23, detailed descriptions of the "unit name" and the "unit figure number" are omitted here. The "component name" indicates the name of electronic components and stores names such as the "a", "b", "c", "d", and "e". The "component figure number" indicates the figure number of electronic components and stores numbers such as the "P1234", "P0023", "P0412", "P0411", and "P3726". The "loading point" indicates a position where electronic components are loaded on a mounter and stores values such as the "001", "002", "003", "004", and "005". The "number of components to be mounted" indicates the number of electronic components to be mounted per one printed circuit board unit and stores values such as the "2", "1", "12", "8", and "3".

In the example of FIG. 6, the two electronic components "a" having the component figure number "P1234" are mounted on the printed circuit board unit "UNIT-A" having the unit figure number "U0100", and the electronic components "a" are loaded on the address "001" of the mounter. In addition, the single electronic component "b" having the component figure number "P0023" is mounted on the printed circuit board unit "UNIT-A" having the unit figure number "U0100", and the electronic components "b" are loaded on the address "002" of the mounter.

In addition, the twelve electronic components "c" having the component figure number "P0412" are mounted on the printed circuit board unit "UNIT-A" having the unit figure number "U0100", and the electronic components "c" are loaded on the address "003" of the mounter. In addition, the eight electronic components "d" having the component figure number "P0411" are mounted on the printed circuit board unit "UNIT-A" having the unit figure number "U0100", and the electronic components "d" are loaded on the address "004" of the mounter. In addition, the three electronic components "e" having the component figure number "P3726" are mounted on the printed circuit board unit "UNIT-A" having the unit figure number "U0100", and the electronic components "e" are loaded on the address "005" of the mounter.

The jig-component combination DB 25 stores combinations of a jig and components. FIG. 7 illustrates an example of information stored in the jig-component combination DB 25. As illustrated in FIG. 7, the jig-component combination DB 25 stores "C1234, T003983, h, P0008, standby space", "C8014, T005689, b, P0023, mounter", "C5102, T099201, k, P3345, standby space" as "jig ID, component ID, component name, component figure number, location".

The "jig ID" is an identifier to identify jigs and stores information such as the "C1234", "C8014", and "C5102". The "component ID" is an identifier to identify components and stores information such as the "T003983", "T005689", and "T099201". Since the "component name" and the "component figure number" are similar to the information stored in the unit figure number DB 24, and detailed descriptions of the "component name" and the "component figure number" are omitted here. The "location" indicates a location of electronic components combined with a jig and stores information such as the "standby space" and "mounter".

In the example of FIG. 7 illustrates that electronic components "h" having the component ID "T003983" and the component figure number "P0008" are combined with a jig having the jig ID "C1234", and the location of the electronic components "h" combined with the jig is the "standby space".

In addition, the electronic components "b" having the component ID "T005689" and the component figure number "P0023" are combined with a jig having the jig ID "C8014", and the location of the electronic components "b" combined with the jig is the mounter. In addition, the electronic components "k" having the component ID "T099201" and the component figure number "P3345" are combined with the jig having the jig ID "C5102", and the location of the electronic components "k" combined with the jig is the standby space.

The jig-component combination DB 25 illustrated in FIG. 7 is created when electronic components delivered by an operator are loaded on a jig. For example, when electronic components are combined with a jig, an operator reads ID number of the electronic components and the jig using a bar-code reader in the changeover support apparatus 10. Based on information read in this way, the jig-component combination DB 25 stores information associating electronic components with a jig.

The component DB 26 illustrated in FIG. 8 stores a component figure number, tape width, component pitch, and number of unused components, etc., for each component ID. FIG. 8 illustrates an example of information stored in the component DB 26. As illustrated in FIG. 8, the component DB 26 stores "T000012, a, P1234, 8, 2, 0.5, 166:00:00, 000:10:12, 3500" as "component ID, component name, component figure number, tape width, component pitch, component height, moisture absorption management time period, non-storage time period, number of unused components". In addition, the component DB 26 stores "T005689, b, P0023, 8, 4, 0.7, 166:00:00, 054:01:00, 2300", "T000421, c, P0412, 12, 8, 12.5, –, 013:11:32, 3200", and "T000033, d, P0411, 8, 2, 0.6, –, 098:00:54, 10000" as "component ID, component name, component figure number, tape width, component pitch, component height, moisture absorption management time period, non-storage time period, number of unused components", respectively.

Since the "component ID", "component name", and the "component figure number" are similar to the information stored in the jig-component combination DB 25, detailed descriptions of the "component ID", "component name", and the "component figure number" are omitted here. In addition, since the "tape width" and "component pitch" are similar to the information stored in the cassette jig condition DB 21, detailed descriptions of the "tape width" and "component pitch" are omitted here. The "component height" indicates a height of a tray-packaged electronic component and stores values such as the "0.5", "0.7", "12.5", and "0.6". The "moisture absorption management time period" indicates a limited time period from a timing of taking out moisture absorption management components to an environment at ordinary temperature and ordinary humidity, to a timing of putting the moisture absorption management components into a reflow furnace, and stores a value of "166:00:00", etc. The "non-storage time period" indicates a total amount of time period when electronic components including the moisture absorption management components are subject to the environment at the ordinary temperature and ordinary humidity, and stores values such as the "000:10:12", "054:01:00", "013:11:32", and "098:00:54". The "number of unused components" indicates the number of unused electronic components in a jig and stores values such as the "3500", "2300", "3200", and "10000".

In the example of FIG. 8, it is indicated that the electronic component "a" having the component ID "T000012" and the component figure number "P1234" has 8 mm of tape width, 2 mm of component pitch, and 0.5 mm of component height, and that 3500 of the electronic components "a" are unused. In addition, a non-storage time period of the electronic components "a" is "000:10:12" that is within the moisture absorption management time period "166:00:00". It is indicated that the electronic component "b" having the component ID "T005689" and the component figure number "P0023" has 8 mm of tape width, 4 mm of component pitch, and 0.7 mm of component height, and that 2300 of the electronic components "b" are unused. In addition, a non-storage time period of the electronic components "b" is "054:01:00" that is within the moisture absorption management time period "166:00:00".

It is indicated that the electronic component "c" having the component ID "T000421" and the component figure number "P0412" has 12 mm of tape width, 8 mm of component pitch, and 12.5 mm of component height, and that 3200 of the electronic components "c" are unused. In addition, a non-storage time period of the electronic components "c" is "013:10:32", however, the electronic components "c" are not moisture absorption management components. It is indicated that the electronic component "d" having the component ID "T000033" and the component figure number "P0411" has 8 mm of tape width, 2 mm of component pitch, and 0.6 mm of component height, and that 10000 of the electronic components "d" are unused. In addition, a non-storage time period of the electronic components "d" is "098:00:54", however, the electronic components "d" are not moisture absorption management components.

The jig-RF tag combination DB 27 stores combination of jigs and RF tags. FIG. 9 illustrates an example of information stored in the jig-RF tag combination DB 27. As illustrated in FIG. 9, the jig-RF tag combination DB 27 stores "C1234, 8, 2, RF0001", "C0011, 16, 8, RF0127", "C8014, 8, 4, RF8120", and "C5102, 24, 12, RF3389" as "jig ID, tape width, component pitch, RF tag ID".

Since the "jig ID" is similar to the information stored in the jig-component combination DB 25, a detailed description of the "jig ID" is omitted here. In addition, since the "tape width" and the "component pitch" are similar to the information stored the cassette jig condition DB 21, detailed descriptions of the "tape width" and the "component pitch" are omitted here. The "RF tag ID" is an identifier to identify RF tags and stores information such as the "RF0001", "RF0127", "RF8120", and "RF3389".

In the example of FIG. 9, an RF tag having the RF tag ID "RF0001" is attached to a jig having the jig ID "C1234", 8 mm of tape width, and 2 mm of component pitch. In addition, an RF tag having the RF tag ID "RF0127" is attached to a jig having the jig ID "C0011", 16 mm of tape width, and 8 mm of component pitch.

In addition, an RF tag having the RF tag ID "RF8120" is attached to a jig having the jig ID "C8014", 8 mm of tape width, and 4 mm of component pitch. In addition, an RF tag having the RF tag ID "RF3389" is attached to a jig having the jig ID "C5102", 24 mm of tape width, 12 mm of component pitch.

The RF antenna DB 28 stores each combination between antenna IDs and locations of the antenna IDs. FIG. 10 illustrates an example of information stored in the RF antenna DB 28. As illustrated in FIG. 10, the RF antenna DB 28 stores "ANT 1, standby space 1", "ANT 2, standby space 2", "ANT 3, mounter 4", and "ANT 4, mounter 1" as "antenna ID, location".

The "antenna ID" is an identifier to identify antennas and stores IDs such as the "ANT 1", "ANT 2", "ANT 3", and "ANT 4". The "location" indicates a location of an antenna and stores information such as the "standby space 1", "standby space 2", "mounter 4", and "mounter 1".

In the example of FIG. 10, an antenna identified as the "ANT 1" is located in the "standby space 1", and an antenna identified as the "ANT 2" is located in the "standby space 2". In addition, in the RF antenna DB 28, an antenna identified as the "ANT 3" is located in the "mounter 4", and an antenna identified as the "ANT 4" is located in the "mounter 1".

The controller 30 includes an internal memory (not illustrated) to store a control program, a program defining various processing procedure, etc., and desired data. Returning to FIG. 2, the controller 30 includes an arrangement determination section 31, a component identification section 32, a moisture absorption management section 33, a first light emission section 34, a second light emission section 35, and a third light emission section 36. The controller 30 may be an integrated circuit such as an Application Specific Integrated Circuit (ASIC) and a Field Programmable Gate Array (FPGA), or an electronic circuit such as a Central Processing Unit (CPU) and a Micro Processing Unit (MPU).

The arrangement determination section 31 determines whether or not a setting of changeover operations instructed from an operator adapts to a setting stored in a plan DB 23. For example, the arrangement determination section 31 performs processing for determining an arrangement of electronic components, processing for determining a type of electronic components, and processing for determining that electronic components to be loaded are allowed to be loaded on a mounter, thereby determining a setting of changeover operations instructed from an operator.

The arrangement determination section 31 determines whether an arrangement of electronic components is the fixed arrangement or the optional arrangement. In an embodiment, an example in a state where electronic components are arranged in the optional arrangement is described, that is, the arrangement determination section 31 determines whether or not both of an arrangement of electronic components instructed from an operator and an arrangement of electronic components stored in the plan DB 23 are the optional arrangement.

When it is determined that both of an arrangement instructed from an operator and an arrangement stored in the plan DB 23 are an optional arrangement, the arrangement determination section 31 performs processing for determining a type of electronic components.

In addition, when it is determined that an arrangement of electronic components instructed from an operator is an optional arrangement and an arrangement of electronic components stored in the plan DB 23 is not an optional arrangement, the arrangement determination section 31 determines that the setting of changeover operations instructed from an operator does not match the setting stored in the plan DB 23. In this case, the arrangement determination section 31 outputs a mismatch between the setting of the changeover operations instructed from an operator and the setting stored in the plan DB 23, to the output section 12, and notifies the operator of the mismatch.

In addition, the arrangement determination section 31 notifies the second light emission section 35 of whether an arrangement of electronic components instructed from an operator is an optional arrangement or a fixed arrangement. When the second light emission section 35 receives the notification, the second light emission section 35 performs light emission processing based on the notified arrangement of electronic components.

When the processing for determining a type of electronic components is performed, the arrangement determination section 31 determines whether a type of electronic components instructed from an operator is tape-packaged electronic components or tray-packaged electronic components, and determines whether or not the determined type of electronic components matches a type of electronic components stored in the plan DB 23.

When the arrangement determination section 31 determines that a type of electronic components instructed from an operator matches a type of electronic components stored in the plan DB 23, the arrangement determination section 31 performs processing for determining whether or not electronic components are allowed to be loaded on a mounter.

In addition, when the arrangement determination section 31 determines that a type of electronic components instructed from an operator does not match a type of electronic components stored in the plan DB 23, the arrangement determination section 31 outputs a mismatch between the type of electronic components instructed from an operator and the type of electronic components stored in the plan DB 23, to the output section 12, and notifies the operator of the mismatch.

When it is determined whether or not electronic components are allowed to be loaded on a mounter, the arrangement determination section 31 determines whether or not electronic components are allowed to be loaded on the mounter. The operation to determine whether or not electronic components are allowed to be loaded on a mounter in the arrangement determination section 31 is varied depending on whether the electronic components to be loaded are tape-packaged electronic components or tray-packaged electronic components.

An operation to determine whether or not tape-packaged electronic components are allowed to be loaded on a mounter in the arrangement determination section 31 is described. There are two or more types of cassette jigs depending on shapes of tape-packaged electronic components to be loaded on a cassette jig. Thus, cassette jigs allowed to be loaded on a mounter are different depending on a tape width and a space between stored electronic components. In addition, when cassette jigs are loaded on a mounter, a space between the cassette jigs are different depending on whether the cassette jig is large-scale cassette jig that may include components adapted to large reel width or compact cassette jig that may include components adapted to small reel width. Thus, when tape-packaged electronic components are used, the arrangement determination section 31 determines whether or not all of the tape-packaged electronic components to be mounted on target printed circuit board units are allowed to be loaded on a mounter.

The arrangement determination section 31 determines types of cassette jigs provided with tape-packaged electronic components to be mounted on set printed circuit board units and calculates the number of cassette jigs to be used, from the unit figure number DB 24. After that, the arrangement determination section 31 obtains the number of loading points to be occupied on a mounter for each type of cassette jigs, from the cassette jig condition DB 21. In addition, the arrangement determination section 31 obtains the number of cassette jigs allowed to be loaded on the mounter, from the mounter DB 22, and determines whether or not the obtained number of cassette jigs allowed to be loaded on the mounter exceeds or equals to the number of loading points to be occupied by cassette jigs provided with tape-packaged electronic components to be mounted on printed circuit board units.

When the arrangement determination section 31 determines that the number of cassette jigs allowed to be loaded on the mounter exceeds or equals to the number of loading points to be occupied by cassette jigs provided with tape-packaged electronic components to be mounted on printed circuit board units, the input section 11 is notified that a setting of changeover operations instructed from an operator is allowed to be performed. When the input section 11 receives the notification, the input section 11 may accept specific processing of electronic components to be removed, from an operator. In addition, when the arrangement determination section 31 determines that the number of cassette jigs allowed to be loaded on the mounter falls below the number of loading points to be occupied by cassette jigs provided with tape-packaged electronic components to be mounted on printed circuit board units, the arrangement determination section 31 outputs to the output section 12 that a setting of changeover operations instructed from an operator is not allowed to be performed, and notifies the operator of the result.

An operation to determine whether or not tray-packaged electronic components may be loaded on a mounter in the arrangement determination section 31 is described. Palette jigs provided with tray-packaged electronic components are vertically loaded on a mounter. In addition, the palette jigs are loaded on the mounter so as to keep a distance between the palette jigs based on a height of the tray-packaged electronic components. Thus, when tray-packaged electronic components are to be used for manufacture of printed circuit board units, the arrangement determination section 31 determines whether or not the tray-packaged electronic components to be mounted on target printed circuits are allowed to be loaded on the mounter.

The arrangement determination section 31 obtains types of tray-packaged electronic components to be mounted on set printed circuit board units, from the unit figure number DB 24, and obtains a height of the tray-packaged electronic components from the component DB 26. The arrangement determination section 31 obtains jig loading pitch from the mounter DB 22 and divides the height of the components by the jig loading pitch, thereby obtaining quotient rounded off digits after decimal point as the number of loading points to be occupied by the palette jigs. The arrangement determination section 31 obtains the number of palette jigs allowed to be loaded on the mounter, from the mounter DB 22, and determines whether or not the number of palette jigs allowed to be loaded on the mounter exceeds the number of loading points to be occupied by palette jigs provided with tray-packaged electronic components.

When the arrangement determination section 31 determines the number of palette jigs allowed to be loaded on the mounter exceeds the number of loading points to be occupied by cassette jigs provided with the tray-packaged electronic components to be mounted on printed circuit board units, the arrangement determination section 31 notifies the input section 11 that a setting of changeover operations instructed from an operator may be allowed to be performed. When the input section 11 received the notification, the input section 11 may accept processing for identifying electronic components to be removed, from an operator. In addition, when the arrangement determination section 31 determines the number of palette jigs allowed to be loaded on the mounter fall below the number of loading points to be occupied by cassette jigs provided with the tray-packaged electronic components to be mounted on printed circuit board units, the arrangement determination section 31 outputs to the output section 12 that a setting of changeover operations instructed from an operator is not allowed to be performed, and notifies the operator of the result.

When changeover operations are performed in a plan while the same changeover operations are also performed for other plans, it is difficult for the changeover support apparatus 10 to support the plans in which different electronic components are arranged. In addition, it is difficult for the changeover support apparatus 10 to support changeover operations, when types of target electronic components to be changed over are different. In this case, in the arrangement determination section 31, when changeover operations are supported in a plan while the same changeover operations are also supported for other plans, the arrangement determination section 31 determines whether or not there are two or more settings of arrangement for electronic components among target plans, or determines whether or not there are different target electronic components to be changed over among plans. The arrangement determination section 31 performs processing for determining an arrangement of electronic components, processing for determining a type of electronic components, and processing for determining whether or not electronic components to be loaded are allowed to be loaded on the mounter, with respect to each of the two or more plans, and determines whether or not each of the two or more plans meets conditions for changeover operations.

Returning to FIG. 2, the component identification section 32 performs processing for identifying electronic components to be removed from a mounter, processing for identifying electronic components to be loaded on the mounter, and processing for identifying electronic components to be disassembled, thereby identifying electronic components to be changed over.

The processing for identifying electronic components to be removed from a mounter is described. The component identification section 32 performs processing for identifying component figure numbers of electronic components currently being used for a plan that is "plan being performed" or component figure numbers of components that have used for a plan that is "completed plan", processing for identifying component figure numbers of electronic components to be used for a plan that is "plan to be performed", and processing for identifying electronic components to be removed from the mounter, thereby identifying component figure numbers of the electronic components to be removed from the mounter.

Description is provided for the processing for identifying component figure numbers of electronic components currently being used for a plan that is "plan being performed" or component figure numbers of components that have used for a plan that is "completed plan" in the component identification section 32. When new printed circuit board units to be manufactured are in the mounter, the component identification section 32 identifies an identifier of new components indicating components to be mounted on the new printed circuit board units from the plan DB 23.

When the input section 11 notifies the component identification section 32 that removal processing of electronic components is started, the component identification section 32 searches through the plan DB 23 and determines whether or not a plan that is "plan being performed" exists. The component identification section 32 determines a plan that is "plan being performed" exists, the component identification section 32 obtains a group number of the plan that is "plan being performed" from the plan DB 23. After that, the component identification section 32 obtains a unit figure number that belongs to the same group number as the obtained group number, and "state" of which indicates "plan being performed" or "plan to be performed", from the plan DB 23.

In the example illustrated in FIG. 5, the component identification section 32 obtains a group number "group=A" from the plan DB 23 as a plan that is "plan being performed". In addition, the component identification section 32 obtains the "unit figure number=U0100" of the "UNIT-A" that belongs to the same group number as the obtained group number, and "state" of which indicates "plan being performed", from the plan DB 23. In addition, the component identification section 32 obtains the "unit figure number=U0200" of the "UNIT-B" that belongs to the same group number as the obtained group number, and "state" of which indicates "plan to be performed", from the plan DB 23.

In addition, the component identification section 32 obtains a component figure number that corresponds to the obtained unit figure number, from the unit figure number DB 24. In the example illustrated in FIG. 6, the component identification section 32 obtains the "component figure numbers=P1234, P0023, P0412, P0411, P3726" from the unit figure number DB 24 as the "unit figure number=U0100". In addition, the component identification section 32 obtains the "component figure numbers=P0023, P0008, P9222, P3345" from the unit figure number DB 24 as the "unit figure number=U0200". After that, the component identification section 32 performs processing for identifying a component figure number of a plan to be performed that is described later.

When the component identification section 32 determines a plan that is "plan being performed" does not exist, the component identification section 32 determines whether or not a plan that is "completed plan" exists. When the component identification section 32 determines a plan that is "completed plan" exists, the component identification section 32 obtains a group number of a plan that is "completed plan" and in which the last manufacture is performed from the plan DB 23.

After that, the component identification section 32 obtains a unit figure number that belongs to the same group number as the obtained group number and "state" of which indicates "plan being performed", from the plan DB 23. In addition, the component identification section 32 obtains a component figure number corresponding to the obtained unit figure number from the unit figure number DB 24. After that, the component identification section 32 performs processing for identifying a component figure number of a plan to be performed that is described later. In addition, the component identification section 32 determines that a plan that is "completed plan" does not exist, the component identification section 32 performs processing for identifying a component figure number of a plan that is "plan to be performed".

The processing for identifying component figure numbers of a plan to be performed in the component identification section 32 is described. When new printed circuit board units to be manufactured are in the mounter, the component identification section 32 identifies an identifier of current components indicating components mounted on printed circuit board units currently being manufactured by the mounter, from the plan DB 23.

The component identification section 32 obtains a group number of a plan to be performed, from the plan DB 23. After that, the component identification section 32 obtains a unit figure number that belongs to the same group number as the obtained group number and "state" of which indicates "plan to be performed", from the plan DB 23.

In the example illustrated in FIG. 5, the component identification section 32 obtains "group=A" from the plan DB 23 as a plan that is "plan to be performed". In addition, the component identification section 32 obtains the "unit figure number=U0200" of the "UNIT-B" that belongs to the same group number as the obtained group number ("group=A"), and "state" of which indicates "plan to be performed", from the plan DB 23.

In addition, the component identification section 32 obtains a component figure number corresponding to the obtained unit figure number from the unit figure number DB 24. In the example illustrated in FIG. 6, the component identification section 32 obtains the "component figure numbers=P0023, P0008, P9222, P3345" from the unit figure number DB 24 as the "unit figure number=U0200".

The processing for identifying electronic components to be removed, in the component identification section 32 is described. The component identification section 32 compares the identified identifier of new components with the identified identifier of current components, and identifies the current components that are not included in the new components.

The component identification section 32 obtains a component figure number a location of which is "mounter" from the jig-component combination DB 25. In the example illustrated in FIG. 7, the component identification section 32 obtains the "P1234, P0023, P0412, P0411, P3726" from the jig-component combination DB 25 as component figure numbers a location of which is "mounter".

After that, the component identification section 32 extracts a component figure number that is not used for plans that are "plan being performed" or "completed plan" and that is also not used for plans that are "plan to be performed". In the example illustrated in FIG. 7, the component identification section 32 extracts the "component figure numbers=P1234, P0412, P0411". That is, the component identification section 32 extracts "component names=a, c, d" as electronic components to be removed from the mounter. After that, the component identification section 32 notifies the first light emission section 34 of the extracted component figure numbers of the electronic components as component figure numbers of electronic components to be removed from the mounter.

The processing for identifying electronic components to be loaded on the mounter is described. The component identification section 32 performs processing for identifying a component figure number of electronic components to be loaded, and performs processing for determining whether or not a component figure number of electronic components to be loaded is located in the standby space, thereby identifying a component figure number of electronic components to be loaded on the mounter.

When a component figure number of electronic components to be loaded is identified, the component identification section 32 compares the identified identifier of new components with the identified identifier of current components and identifies the new components that are not included in the current components. When the input section 11 notifies the component identification section 32 that loading processing for electronic components is started, the component identification section 32 obtains a component figure number a location of which is "mounter" from the jig-component combination DB 2. In the example illustrated in FIG. 7, the component identification section 32 obtains the "P1234, P0023, P0412, P0411, P3726" from the jig-component combination DB 25 as component figure numbers location of which are the "mounter".

After that, the component identification section 32 extracts a component figure number that is not used for plans to be performed, from the obtained component figure numbers a location of which is "mounter". In addition, the component identification section 32 identifies the extracted component figure number as a component figure number of "electronic components to be loaded on the mounter". In the example illustrated in FIG. 7, the component identification section 32 extracts the "P0008, P9222, P3345" as component figure numbers.

In addition, when processing for determining whether or not a component figure number of electronic components to be loaded a location of which is "standby space" is performed, the component identification section 32 obtains a component figure number and a component ID that location of which are the "standby space", from the jig-component combination DB 25. In the example illustrated in FIG. 7, the component identification section 32 extracts the "component figure numbers=P0008, P9222, P3345".

In addition, the component identification section 32 determines whether or not the identified component figure number of the "electronic components to be loaded" is included in component figure numbers the obtained "location" of which is the "standby space". When it is determined that the identified component figure number of the "electronic components to be loaded" is included in component figure numbers the obtained "location" of which is "standby space", the component identification section 32 notifies the second light emission section 35 of the identified component figure number of the "electronic components to be loaded". In the example illustrated in FIG. 7, the component identification section 32 notifies the second light emission section 35 of the "component figure numbers=P0008, P9222, P3345".

In addition, when it is determined that the identified component figure number of the "electronic components to be loaded" is included in component figure numbers the obtained "location" of which is the "standby space", the component identification section 32 determines that components to be loaded are not prepared in the "standby space", thereby ending the processing.

The processing for identifying electronic components to be disassembled is described. When manufacture of printed circuit board units is completed, the component identification section 32 identifies electronic components to be removed from a jig and to be disassembled. That is, the component identification section 32 identifies electronic components not to be used for plans to be performed, from electronic components removed from the mounter after processing for loading electronic components by an operator ends.

For example, when the input section 11 notifies the component identification section 32 that disassembly processing for electronic components is started, the component identification section 32 extracts a unit figure number corresponding to a plan to be performed, from the plan DB 23 and identifies a component figure number corresponding to the extracted unit figure number from the unit figure number DB 24. In an example illustrated in FIG. 5, the component identification section 32 extracts the "U0300" and "U0400" as unit figure numbers a state of which indicates "plan to be performed" and identifies component figure numbers corresponding to the extracted unit figure numbers from the unit figure number DB 24. For illustrative convenience, description is provided below using a component name instead of a component figure number, such as "component names=e, n, o, p, q" corresponding to the "unit figure number=U0300" and "component names=d, s, t, u, v" corresponding to the "unit figure number=U0400".

After that, the component identification section 32 determines whether or not removed electronic components are included in the identified component names. When the component identification section 32 determines removed electronic components are included in the identified component names, it is determined that the removed electronic components are to be used for plans to be performed, and specific processing may not be performed for the components.

In addition, when the component identification section 32 determines removed electronic components are not included in the identified component names, it is determined that the removed electronic components are not to be used for plans to be performed, and the removed electronic components are identified as components to be disassembled. In addition, the component identification section 32 extracts component figure numbers of electronic components a location of which is "standby space" from component figure numbers of the identified electronic components to be disassembled, and notifies the third light emission section 36 of the extracted component figure numbers. In an example illustrated in FIG. 5, the component identification section 32 identifies the "component names=a, c" as electronic components to be disassembled, from "component names=a, c, d" corresponding to electronic components removed from the mounter, and notifies the third light emission section 36 of component figure numbers corresponding to the component names.

Returning to FIG. 2, each time a certain time period elapses, the moisture absorption management section 33 measures a non-storage time period that is a time period during which moisture absorption management components are outside the moisture absorption storage. When a location of the moisture absorption management components is not identified by an RF antenna a location of which is "standby space", the moisture absorption management section 33 determines that the moisture absorption management components are outside the moisture absorption storage, that is, under an environment at ordinary temperature and ordinary humidity. In addition, the moisture absorption management section 33 measures a time period during which the moisture absorption management components are outside the "standby space", and regards the measured time period as a non-storage time period. In addition, the moisture absorption management section 33 records the measured time period to the "non-storage time period" in the component DB 26.

In addition, when the component identification section 32 notifies the moisture absorption management section 33 of component figure numbers of electronic components to be loaded on a mounter, the moisture absorption management section 33 determines whether or not a moisture absorption management time period elapses in the electronic components corresponding to the component figure numbers. The moisture absorption management section 33 obtains a "moisture absorption management time period" from the component DB 26 and determines whether or not the measured non-storage time period goes over the "moisture absorption management time period".

When the moisture absorption management section 33 determines the measured non-storage time period does not go over the "moisture absorption management time period", the moisture absorption management section 33 identifies electronic components in which the "moisture absorption management time period" does not elapse, associates component IDs of the identified electronic components with the determination that the "moisture absorption management time period" does not elapse in the electronic components, and notifies to the second light emission section 35 of the association of the component IDs with the determination. In addition, when the moisture absorption management section 33 determines the measured non-storage time period goes over the "moisture absorption management time period", the moisture absorption management section 33 identifies electronic components in which the "moisture absorption management time period" elapses, associates component IDs of the identified electronic components with the determination that the "moisture absorption management time period" elapse in the electronic components, and notifies the second light emission section 35 of the association of the component IDs with the determination.

In the example illustrated in FIG. 8, the moisture absorption management section 33 determines a moisture absorption management time period "166:00:00" does not elapse in "component ID=T000012" because a non-storage time period of the "component ID=T000012" is "000:10:12". In addition, the moisture absorption management section 33 determines the moisture absorption management time period "166:00:00" does not elapse in the "component ID=T005689" because a non-storage time period of the "component ID=T005689" is "054:01:00". After that, the moisture absorption management section 33 notifies the second light emission section 35 that the non-storage time periods of the "component IDs=T000012, T005689" do not go over the moisture absorption management time period.

Returning to FIG. 2, the first light emission section 34 identifies a jig provided with current components identified by the component identification section 32 and causes a light-emitting element included in the identified jig to emit light. That is, the first light emission section 34 performs processing for obtaining a jig ID corresponding to a component figure number of electronic components to be removed, processing for obtaining an RF tag ID corresponding to the obtained jig ID, and processing for transmitting a command to the obtained RF tag ID, thereby causing an LED to emit light.

The processing for obtaining a jig ID corresponding to a component figure number of electronic components to be removed in the first light emission section 34 is described. When the component identification section 32 notifies the first light emission section 34 of a component figure number of electronic components to be removed from a mounter, the first light emission section 34 obtains a jig provided with the electronic components to be removed from the mounter, from the jig-component combination DB 25.

The first light emission section 34 obtains a jig ID corresponding to the component figure number identified by the component identification section 32 from the jig-component combination DB 25. In the example illustrated in FIG. 7, the first light emission section 34 obtains "jig IDs=C0111, C2248, C0365" corresponding to the "component figure numbers=P1234, P0412, P0411".

The processing for obtaining an RF tag ID corresponding to the obtained jig ID in the first light emission section 34 is described. The first light emission section 34 identifies an RF tag attached to a jig provided with identified current components. For example, the first light emission section 34 obtains an RF tag ID corresponding to the obtain jig ID from the jig-RF tag combination DB 27. In the example illustrated in FIG. 9, the first light emission section 34 obtains "RF tag IDs=RF2625, RF0312, RF7001" corresponding to the "jig IDs=C0111, C2248, C0365".

The processing for transmitting a command to the obtained RF tag ID in the first light emission section 34 is described. The first light emission section 34 causes a light-emitting element included in the identified RF tag to emit light. For example, the first light emission section 34 obtains an antenna ID a location of which is "mounter", from the RF antenna DB 28, and transmits a command to the obtain RF tag ID, thereby causing an LED to emit light.

In the example illustrated in FIG. 10, the first light emission section 34 obtains "antenna ID=ANT 4" a location of which is the "mounter 1" from the RF antenna DB 28 and transmits a command that causes the "RF tag IDs=RF2625, RF0312, RF7001" to emit light, to the obtained the "antenna ID=ANT 4".

In addition, the first light emission section 34 receives information in which the RF tag IDs are associated with the antenna ID, from the communication control I/F 13. The first light emission section 34 identifies a location of an antenna from the received antenna ID.

In addition, the first light emission section 34 identifies a corresponding jig ID from the RF tag IDs and identifies a location of the identified jig ID as a location of the identified antenna. After that, the first light emission section 34 causes the location of the identified jig to be stored in the jig-component combination DB 25. As a result, the jig-component combination DB 25 may update and store a location of electronic components as latest information.

Returning to FIG. 2, when a jig in which the first light emission section 34 causes a light-emitting element to emit light is removed from a mounter, the second light emission section 35 identifies a jig provided with identified new components and causes a light-emitting element included in the identified jig to emit light. That is, the second light emission section 35 performs processing for obtaining a jig ID corresponding to a component figure number of electronic components to be loaded, processing for obtaining an RF tag ID corresponding to the obtained jig ID, and processing for transmitting a command to the obtained RF tag ID, thereby causing an LED to emit light.

The processing for obtaining a jig ID corresponding to a component figure number of electronic components to be loaded, in the second light emission section 35 is described. When the component identification section 32 notifies the second light emission section 35 of a component figure number of electronic components to be loaded on a mounter, the second light emission section 35 identifies a jig provided with electronic components to be loaded on the mounter, from the jig-component combination DB 25. In the example illustrated in FIG. 7, the second light emission section 35 obtains the "jig IDs=C1234, C0011, C5102" corresponding to the "component figure numbers=P0008, P9222, P3345".

In addition, the second light emission section 35 identifies a jig provided with new components in which a time period that has elapsed after delivery from the standby space storing electronic components falls below a specific value, from the identified new components. That is, the second light emission section 35 extracts a component ID of electronic components in which a moisture absorption management time period does not elapse and of which the moisture absorption management section 33 notifies, from obtained component IDs. Here, description is provided for a case where a notification which indicates that a moisture absorption management time period does not elapse in electronic components is received from the moisture absorption management section 33.

The processing for obtaining an RF tag ID corresponding to the obtained jig ID in the second light emission section 35 is described. The second light emission section 35 identifies an RF tag attached to a jig provided with the identified new components. The second light emission section 35 obtains the identified RF tag combined with the jig from the jig-RF tag combination DB 27. In the example illustrated in FIG. 9, the second light emission section 35 obtains the "RF tag IDs=RF0001, RF0127, RF3389" corresponding to the "jig IDs=C1234, C0011, C5102".

The processing for transmitting a command to the obtained RF tag ID in the second light emission section 35 is described. The second light emission section 35 causes a light-emitting element included in the identified RF tag to emit light. For example, the second light emission section 35 obtains an antenna ID a location of which is "standby space" from the RF antenna DB 28. In addition, the second light emission section 35 transmits a command to the obtained RF tag ID through the obtained antenna ID, thereby causing an LED to emit light.

In the example illustrated in FIG. 10, the second light emission section 35 obtains the "antenna ID=ANT 1" a location of which is the "standby space 1" from the RF antenna DB 28 and transmits a command causing the "RF tag IDs=RF0001, RF0127, RF3389" to emit light, to the obtained the "antenna ID=ANT 1".

When the second light emission section 35 receives a notification indicating that a non-storage time period of moisture absorption management components goes over a moisture absorption management time period, from the moisture absorption management section 33, the second light emission section 35 may cause the notified moisture absorption management components to blink. For example, the second light emission section 35 obtains a jig ID and a component ID corresponding to the component figure number identified by the component identification section 32, from the jig-component combination DB 25.

In addition, the second light emission section 35 extracts a component ID of electronic components in which a moisture absorption management time period elapses and of which the moisture absorption management section 33 notifies, from the obtained component IDs. After that, the second light emission section 35 obtains an RF tag ID corresponding to the obtained jig ID from the jig-RF tag combination DB 27. The second light emission section 35 obtains an antenna ID a location of which is "standby space" from the RF antenna DB 28. In addition, the second light emission section 35 transmits a command to the obtained RF tag ID through the obtained antenna ID, thereby causing an LED to emit light.

Returning to FIG. 2, when manufacture of printed circuit board units completes, the third light emission section 36 identifies a jig provided with electronic components to be removed and disassembled and causes a light-emitting element included in the identified jig to emit light. That is, when the component identification section 32 notifies the third light emission section 36 of a component figure number of electronic components to be disassembled, the third light emission section 36 identifies a jig provided with electronic components to be disassembled and transmits a command to an RF tag combined with the identified jig, thereby causing an LED to emit light.

The third light emission section 36 obtains a jig ID corresponding to the component figure number identified by the component identification section 32, from the jig-component combination DB 25. In the example illustrated in FIG. 7, the third light emission section 36 obtains the "jig IDs=C0111, C2248" corresponding to the "component figure numbers=P1234, P0412".

After that, the third light emission section 36 obtains an RF tag ID corresponding to the obtained cassette jig ID from the jig-RF tag combination DB 27. In the example illustrated in FIG. 9, the third light emission section 36 obtains the "RF tag IDs=RF2625, RF0312" corresponding to the "jig IDs=C0111, C2248".

In addition, the third light emission section 36 obtains an antenna ID a location of which is "standby space" from the RF antenna DB 28. In addition, the third light emission section 36 transmits a command to the obtained RF tag ID through the obtained antenna ID, thereby causing an LED to emit light. In the example illustrated in FIG. 10, the third light emission section 36 obtains the "antenna ID=ANT 1" a location of which is the "standby space 1" from the RF antenna DB 28 and transmits a command causing the "RF tag IDs=RF2625, RF0312" to emit light, to the obtained "antenna ID=ANT 1"

Figure 11:
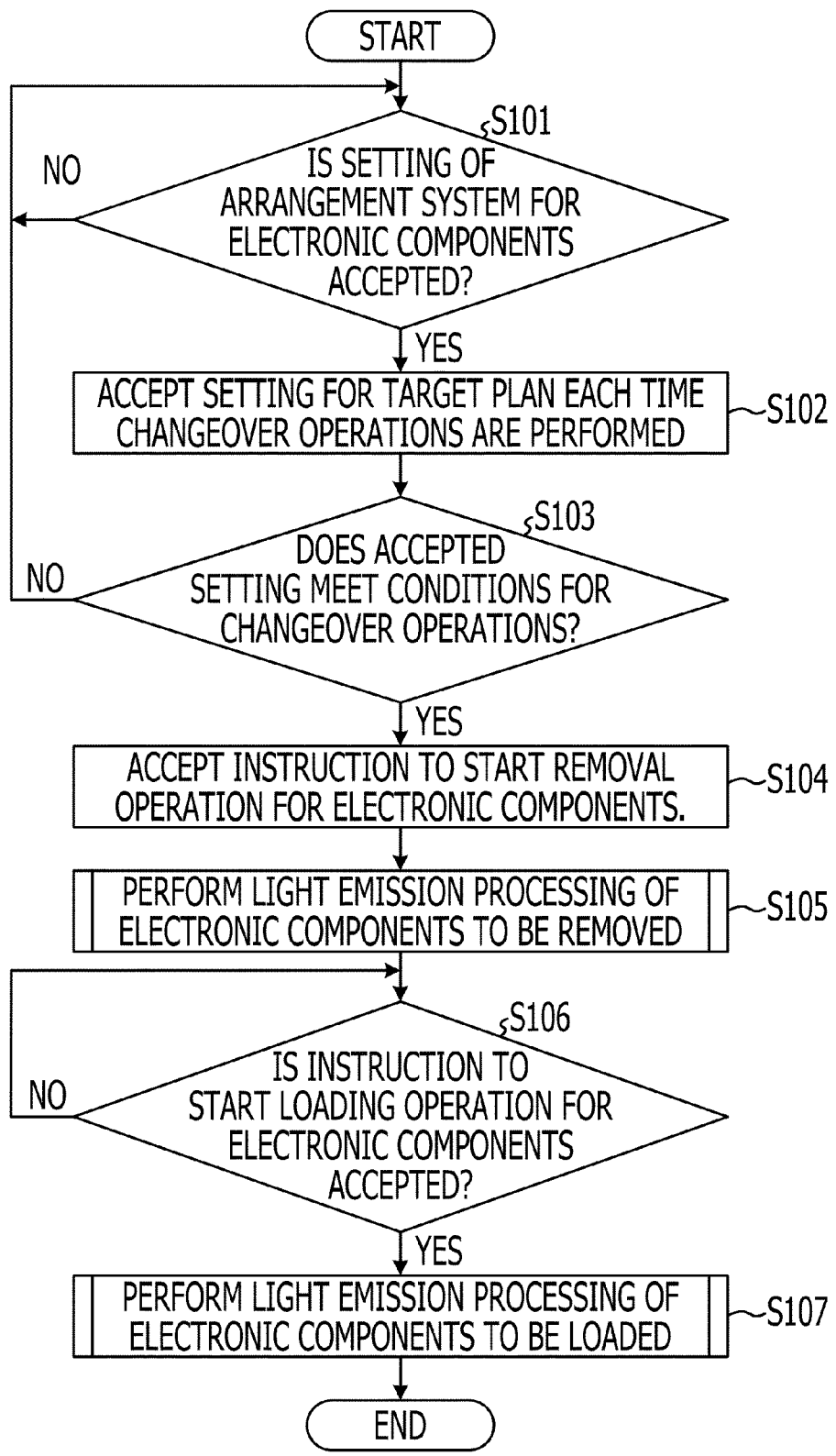
FIG. 11 illustrates a flowchart of processing in a changeover support apparatus according to an embodiment.

Processing in the changeover support apparatus 10 according to an embodiment is described below with reference to FIG. 11. FIG. 11 illustrates a flowchart of the processing in the changeover support apparatus 10 according to an embodiment.

When the input section 11 accepts a setting of an arrangement for electronic components (YES, in Operation S101), a setting of a target plan is accepted from an operator each time changeover operations are performed (Operation S102). After that, the arrangement determination section 31 determines whether or not the accepted setting meets the conditions for the changeover operations (Operation S103). When the arrangement determination section 31 determines the accepted setting meets the conditions for the changeover operations (YES, in Operation S103), the arrangement determination section 31 accepts an instruction to start a removal operation of electronic components (Operation S104). In addition, the arrangement determination section 31 determines the accepted setting does not meet the conditions for the changeover operations (NO, in Operation S103), the process returns to Operation S101, and a setting of an arrangement for electronic components is accepted. In this case, the changeover support apparatus 10 may output the setting that does not meet the conditions for the changeover operations.

After that, the changeover support apparatus 10 performs light emission processing of electronic components to be removed (Operation S105). The changeover support apparatus 10 determines whether or not an instruction to start a loading operation of electronic components is accepted from an operator after the changeover support apparatus 10 has performed the light emission processing of electronic components to be removed (Operation S106). When the changeover support apparatus 10 determines that an instruction to start a loading operation of electronic components is accepted from an operator (YES, in Operation S106), the changeover support apparatus 10 performs light emission processing of electronic components to be loaded (Operation S107). In addition, when the changeover support apparatus 10 determines that an instruction to start a loading operation of electronic components is not accepted from an operator (NO, in Operation S106), the changeover support apparatus 10 does not the perform light emission processing of electronic components to be loaded until an instruction to start the loading operation of electronic components is accepted from an operator.

Figure 12:
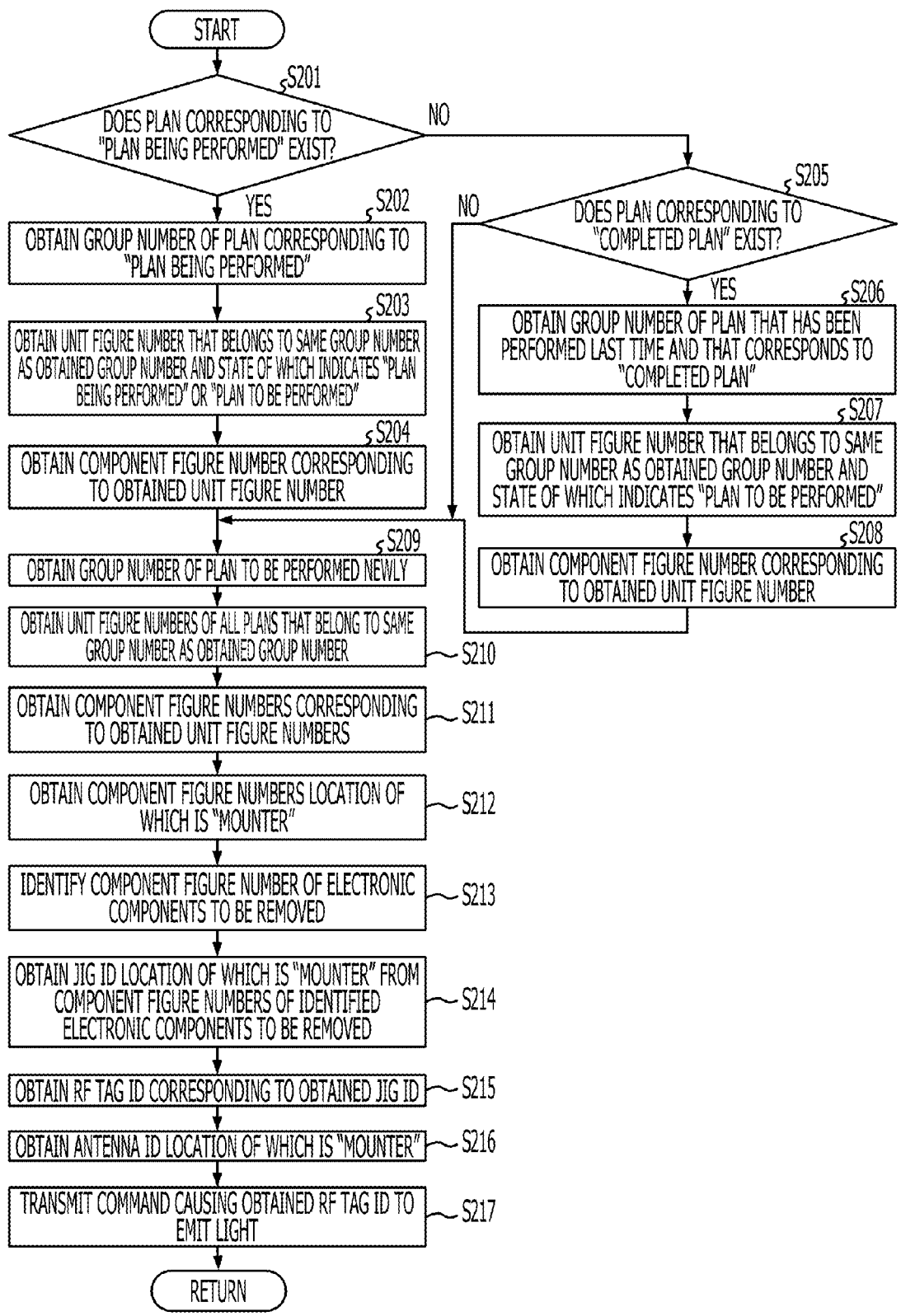
FIG. 12 illustrates a flowchart of light emission processing of electronic components to be removed, in a changeover support apparatus according to an embodiment.

The light emission processing of electronic components to be removed in the changeover support apparatus 10 according to an embodiment is described. FIG. 12 illustrates a flowchart of the light emission processing of electronic components to be removed in the changeover support apparatus 10 according to an embodiment. The light emission processing described below is processing corresponding to Operation S105 illustrated in FIG. 11.

The component identification section 32 determines whether or not a plan corresponding to a "plan being performed" exists (Operation S201). When the component identification section 32 determines that a plan corresponding to a "plan being performed" exists (YES, in Operation S201), the component identification section 32 obtains a group number of the plan corresponding to a "plan being performed" from the plan DB 23 (Operation S202). After that, the component identification section 32 obtains a unit figure number that belongs to the same group number as the obtained group number and "state" of which indicates a "plan being performed" or "plan to be performed", from the plan DB 23 (Operation S203). In addition, the component identification section 32 obtains a component figure number corresponding to the unit figure number obtained in Operation S203, from the unit figure number DB 24 (Operation S204).

In addition, when the component identification section 32 determines a plan corresponding to a "plan being performed" does not exist (NO, in Operation S201), the component identification section 32 determines whether or not a plan corresponding to a "completed plan" exists (Operation S205). When the component identification section 32 determines a plan corresponding to a "completed plan" exists (YES, in Operation S205), the component identification section 3 obtains a group number of a plan that has been performed last time and that corresponds to a "completed plan", form the plan DB 23 (Operation S206). After that, the component identification section 32 obtains a unit figure number that belongs to the same group number as the obtained group number, and "state" of which indicates a "plan to be performed", from the plan DB 23 (Operation S207). In addition, the component identification section 32 obtains a component figure number corresponding to the unit figure number obtained in Operation S207 from the unit figure number DB 24 (Operation S208). In addition, the component identification section 32 determines a plan corresponding to a "completed plan" does not exist (NO, in Operation S205), the process proceeds to Operation S209.

The component identification section 32 obtains a group number of a plan to be performed newly, from the plan DB 23 (Operation S209). After that, the component identification section 32 obtains unit figure numbers of all plans that belong to the same group number as the obtained group number from the plan DB 23 (Operation S210). In addition, the component identification section 32 obtains component figure numbers corresponding to the unit figure numbers obtained in Operation S210 from the unit figure number DB 24 (Operation S211).

The component identification section 32 obtains component figure numbers locations of which are "mounter" from the jig-component combination DB 25 (Operation S212). After that, the component identification section 32 identifies a component figure number of electronic components to be removed. That is, the component identification section 32 extracts a component figure number that is included in the component figure numbers obtained in Operation S212 and that is not included the component figure numbers obtained in Operation S204, Operation S208, and Operation S209 (Operation S213).

The first light emission section 34 obtains a jig ID a location of which is "mounter" from component figure numbers of the electronic components to be removed identified in Operation S213 (Operation S214). After that, the first light emission section 34 obtains an RF tag ID corresponding to the jig ID obtained in Operation S214 from the jig-RF tag combination DB 27 (Operation S215). After that, the first light emission section 34 obtains an antenna ID a location of which is "mounter" from the RF antenna DB 28 (Operation S216). In addition, the first light emission section 34 transmits a command causing the obtained RF tag ID to emit light, to the obtained antenna ID (Operation S217).

In the procedures of the processing in the changeover support apparatus 10, the procedures from Operation S201 to Operation S208 may be changed with the procedures from Operation S209 to Operation S211, and may be performed while the procedures from Operation S209 to Operation S211 are performed.

Figure 13:
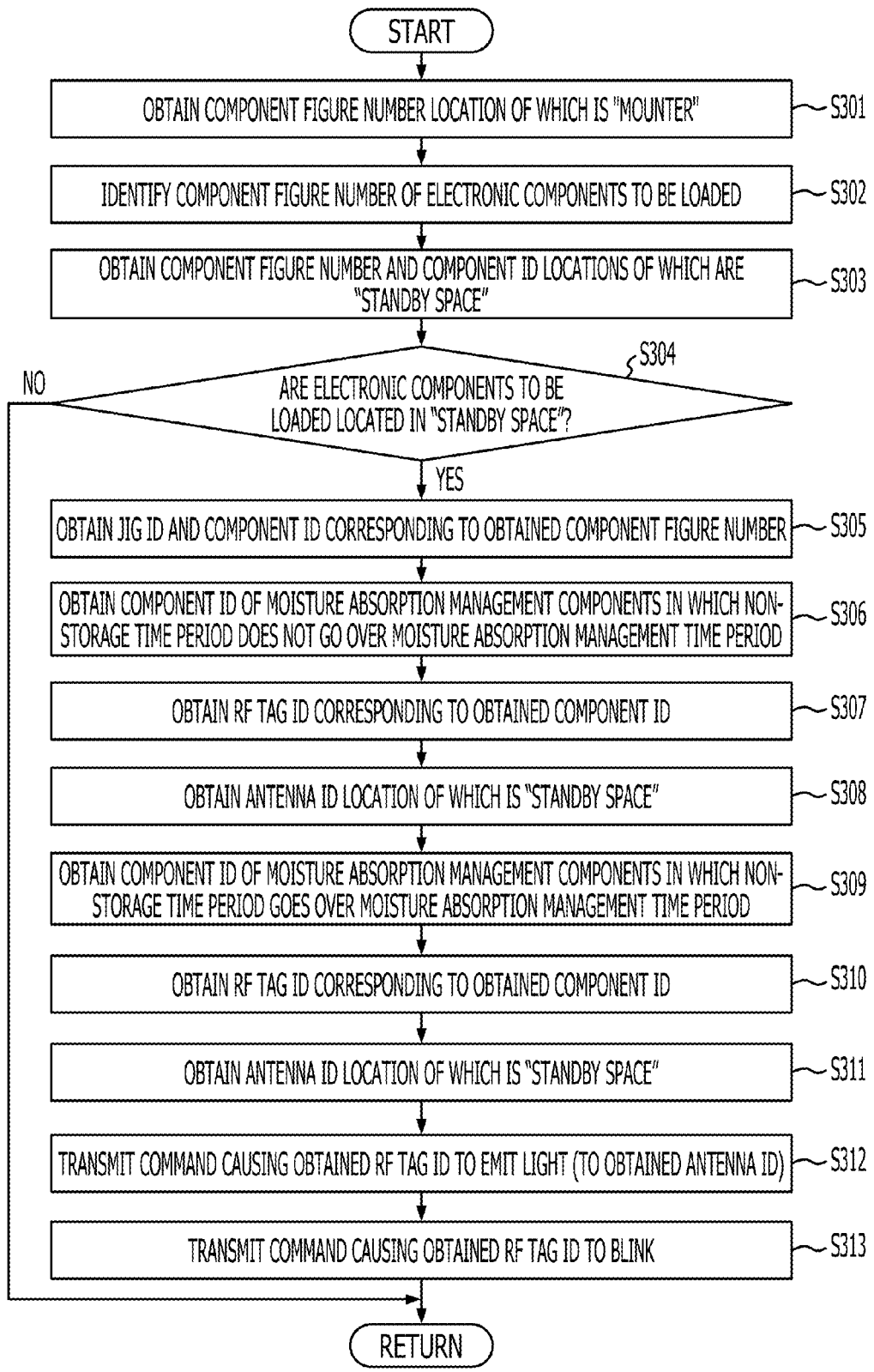
FIG. 13 illustrates a flowchart of light emission processing of electronic components to be loaded, in the changeover support apparatus according to an embodiment.

The light emission processing of electronic components to be loaded, in the changeover support apparatus 10 according to an embodiment is described. FIG. 13 illustrates a flowchart of the light emission processing of electronic components to be loaded, in the changeover support apparatus 10 according to an embodiment. The light emission processing described below is processing corresponding to Operation S107 illustrated in FIG. 11.

The component identification section 32 obtains component figure numbers locations of which are "mounter" from the jig-component combination DB 25 (Operation S301). After that, the component identification section 32 identifies a component figure number of electronic components to be loaded. That is, the component identification section 32 extracts a component figure number that is included in the component figure numbers obtained in Operation S301 and not included in the component figure numbers obtained in Operation S211 (Operation S302). In addition, the component identification section 32 obtains a component figure number and a component ID location of which are "standby space" from the jig-component combination DB 25 (Operation S303).

The component identification section 32 determines whether or not electronic components to be loaded are located in "standby space" (Operation S304). The component identification section 32 determines whether or not the component figure number extracted in Operation S302 is included in the component figure number obtained in Operation S303. When the component identification section 32 determines that the component figure number extracted in Operation S302 is included in the component figure number obtained in Operation S303 (YES, in Operation S304), the second light emission section 35 performs processing in Operation S305. That is, the second light emission section 35 obtains a jig ID and a component ID corresponding to the component figure number obtained in Operation S303 (Operation S305). In addition, when the component identification section 32 determines that the component figure number extracted in Operation S302 is not included in the component figure number obtained in Operation S303 (NO, in Operation S304), the component identification section 3 determines that the electronic components to be loaded are not prepared in "standby space", and the process ends.

The moisture absorption management section 33 obtains a component ID of moisture absorption management components in which a non-storage time period does not go over a moisture absorption management time period, from the component DB 26 (Operation S306). After that, the second light emission section 35 obtains an RF tag ID corresponding to the component ID obtained in Operation S306 (Operation S307). The second light emission section 35 obtains a jig ID corresponding to the component ID obtained in Operation S306 from the jig-component combination DB 25, and obtains an RF tag ID corresponding to the obtained jig ID from the jig-RF tag combination DB 27. In addition, the second light emission section 35 obtains an antenna ID a location of which is "standby space" (Operation S308).

The moisture absorption management section 33 obtains a component ID of moisture absorption management components in which a non-storage time period goes over a moisture absorption management time period, from the component DB 26 (Operation S309). After that, the second light emission section 35 obtains an RF tag ID corresponding to the component ID obtained in Operation S309 (Operation S310). The second light emission section 35 obtains a jig ID corresponding to the component ID obtained in Operation S309 from the jig-component combination DB 25, and obtains an RF tag ID corresponding to the obtained jig ID, form the jig-RF tag combination DB 27. In addition, the second light emission section 35 obtains an antenna ID a location of which is "standby space" (Operation S311).

The second light emission section 35 transmits a command causing the RF tag ID obtained in Operation S307 to emit light, to the antenna ID obtained in Operation S308 (Operation S312). In addition, the second light emission section 35 transmits a command causing the RF tag ID obtained in Operation S310 to blink, to the antenna ID obtained in Operation S311 (Operation S313).

In the procedures of the processing in the changeover support apparatus 10, the procedures from Operation S306 to Operation S308 may be changed with the procedures from Operation S309 to Operation S311, and may be performed while the procedures from Operation S309 to Operation S311 are performed. In addition, the processing in Operation S312 may be changed with the processing in Operation S313, and may be performed while the processing in Operation S313 is performed.

As described above, when electronic components are arranged in the optional arrangement, the changeover support apparatus 10 according to an embodiment causes an RF tag attached to a jig to which electronic components are provided to emit light, thereby notifying an operator of electronic components to be loaded and removed on and from a mounter. In the changeover support apparatus 10 according to an embodiment, an operator may perform changeover operations without searching electronic components.

Generally, electronic components used for two or more plans are arranged as common components, and when electronic components are arranged in the fixed arrangement in which (groups of) electronic components are associated with loading points, common components may be searched based on the loading points desirably. On the other hand, when electronic components are arranged in the optional arrangement, an operator searches common components from electronic components loaded on a mounter each time changeover operations are performed. However, the changeover support apparatus 10 according to an embodiment identifies electronic components that are not included in common components as electronic components to be removed from a mounter, from electronic components loaded on a the mounter, and causes an RF tag of a jig to which the identified electronic components are provided, to emit light, thereby notifying an operator of the identified electronic components.

Figure 14:
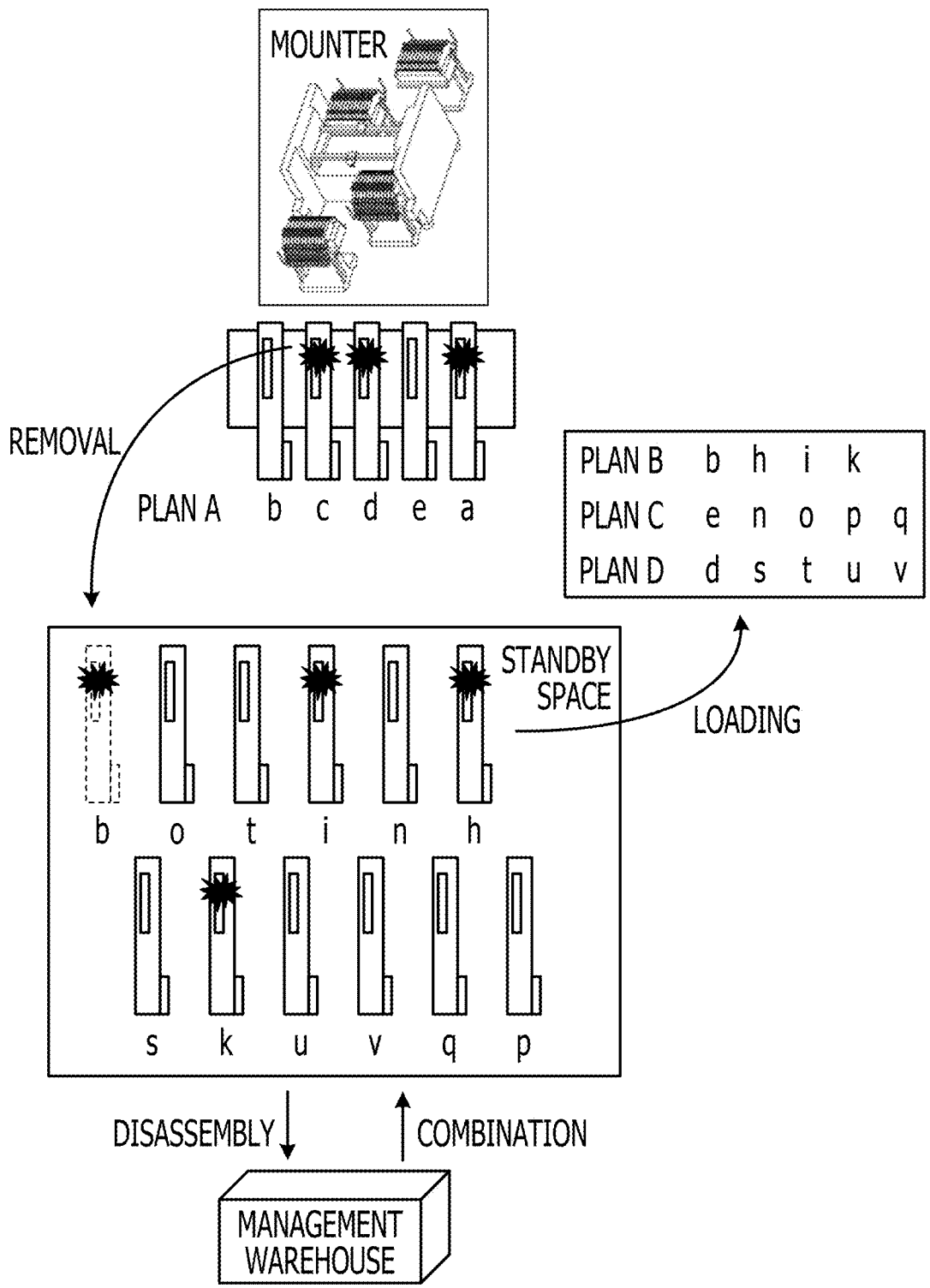
FIG. 14 illustrates a changeover support operation in the changeover support apparatus according to an embodiment.

FIG. 14 illustrates a changeover support operation in the changeover support apparatus 10 according to an embodiment. In the example illustrated in FIG. 14, the changeover support apparatus 10 identifies electronic components "a, c, d" as electronic components to be removed from the mounter and causes RF tags of jigs on which the identified electronic components "a, c, d" are loaded to emit light, thereby notify an operator of the jigs. Thus, in the changeover support apparatus 10, the operator may not search common components, thereby reducing workload of the changeover operations. That is, in the changeover support apparatus 10, the operator may perform the changeover operations desirably.

In addition, generally, an operator preliminary prepares electronic components to be loaded for each plan. However, the changeover support apparatus 10 according to an embodiment identifies electronic components that are not included in common components as electronic components to be loaded on a mounter, from electronic components to be mounted on printed circuit board units to be newly manufactured, and causes an RF tag of a jig to which the identified electronic components are provided, to emit light, thereby notifying an operator of the identified electronic components. In the example illustrated in FIG. 14, the changeover support apparatus 10 identifies electronic components "h, i, k" as electronic components to be loaded on the mounter, and causes an RF tag of a jig to which the identified electronic components "h, i, k" are provided, to emit light, thereby notifying the operator of the identified electronic components. Thus, in the changeover support apparatus 10, an operator may arrange electronic components to be loaded without preparing the electronic components for each plan, thereby reducing workload of changeover operations. In the changeover support apparatus 10 according to an embodiment, an operator may perform the changeover operations desirably.

In addition, when an operator takes in and out moisture absorption management components to and from the moisture absorption storage, the record of the time is generally managed by hand-writing or time stamps. As a result, the management of the time records is inaccurate because an operator sometimes forgets to record the time. In addition, an operator may not notice that a moisture absorption management time period elapses in moisture absorption arrangement components. However, the changeover support apparatus 10 according to an embodiment causes an RF tag of a jig to which the moisture absorption management components are provides, to emit light when a non-storage time period does not go over a certain moisture absorption management time period in moisture absorption management components. Thus, the changeover support apparatus 10 according to an embodiment may reduce if not prevent an operator from using electronic components in which a moisture absorption management time period elapses, by mistake.

In addition, when a non-storage time period goes over a certain moisture absorption management time period in moisture absorption management components, the changeover support apparatus 10 according to an embodiment causes an RF tag of a jig to which the moisture absorption management components are provided, to blink. Thus, the changeover support apparatus 10 according to an embodiment may reduce if not prevent an operator from neglecting electronic components in which a moisture absorption management time period elapses.

In addition, generally, when an operator removes electronic components from a mounter, the operator identifies components to be disassembled with reference to a paper list that is referred to as an arrangement chart and that is created from the plan DB and the unit figure number DB. However, the changeover support apparatus 10 according to an embodiment causes an RF tag attached to a jig provide with electronic components to be disassembled which are not used for plans to be performed to emit light in "standby space". As a result, the operator may search components to be disassembled desirably. In the changeover support apparatus 10 according to an embodiment, an operator may perform the confirmation of the electronic components to be disassembled without complicated operations, for each group of electronic components removed from a mounter, thereby reducing workload of changeover operations. That is, in the changeover support apparatus 10, an operator performs the changeover operations desirably.

In addition, generally, it is difficult to remove electronic components from a mounter until the mounter stops after manufacture of printed circuit board units ends. However, in recent years, a mounter has been developed from which electronic components may be removed even while the mounter is being operated, and the changeover support apparatus 10 according to an embodiment may support changeover operations even while a mounter is being operated.

As described above, in an embodiment, the description is provided for the example in which changeover operations by an operator are supported by the changeover support apparatus 10 when electronic components to be mounted on printed circuit boards using a mounter are arranged in the optional arrangement. However, the changeover operations arranged by the fixed arrangement sometimes help the manufacture of printed circuit board units even when the allocation operation of electronic components is generally complicated. For example, when the same type of multiple printed circuit board units are manufactured and electronic components are loaded on a mounter in the fixed arrangement, a time period before the electronic components are mounted on the printed circuit boards through the mounter may be optimized. Thus, in an embodiment, description is provided for an example in which changeover operations by an operator are supported by a changeover support apparatus 50 when electronic components to be mounted on printed circuit boards using a mounter are arranged in the fixed arrangement.

The fixed arrangement in which the changeover operations are supported by the changeover support apparatus 50 according to an embodiment supports is described below. When electronic components are arranged in the fixed arrangement, groups of components are loaded on loading points specified by an apparatus program, and generally, changeover operations of the components are performed per plan unit. This is because when changeover operations for a certain plan are performed while the same changeover operations for other plans are performed, the program is preliminary set so that a group of common components used for printed circuit board units across the two or more plans is loaded on the same loading point.

In addition, when printed circuit board units in which exclusive components that are generally used for specific printed circuit board units are not desired are manufactured, loading points on which the exclusive components are to be loaded are not used. When an apparatus program is set so that other electronic components are mounted on the loading points that are generally used for the exclusive components, changeover operations for a certain plan may not be performed while the same changeover operations for other plans are performed because it is difficult for an operator to load different types of components on the same loading point of a mounter at the same time.

When components are arranged in the optional arrangement according to an embodiment, the components may not be loaded on loading points specified by a program installed into a mounter, thereby writing a program without any regard for loading of the components. That is, as long as a jig may be loaded on a mounter, changeover operations of components for a certain type of printed circuit board unit may be performed while the same component changeover operations for other types of printed circuit board units are performed.

Figure 15:
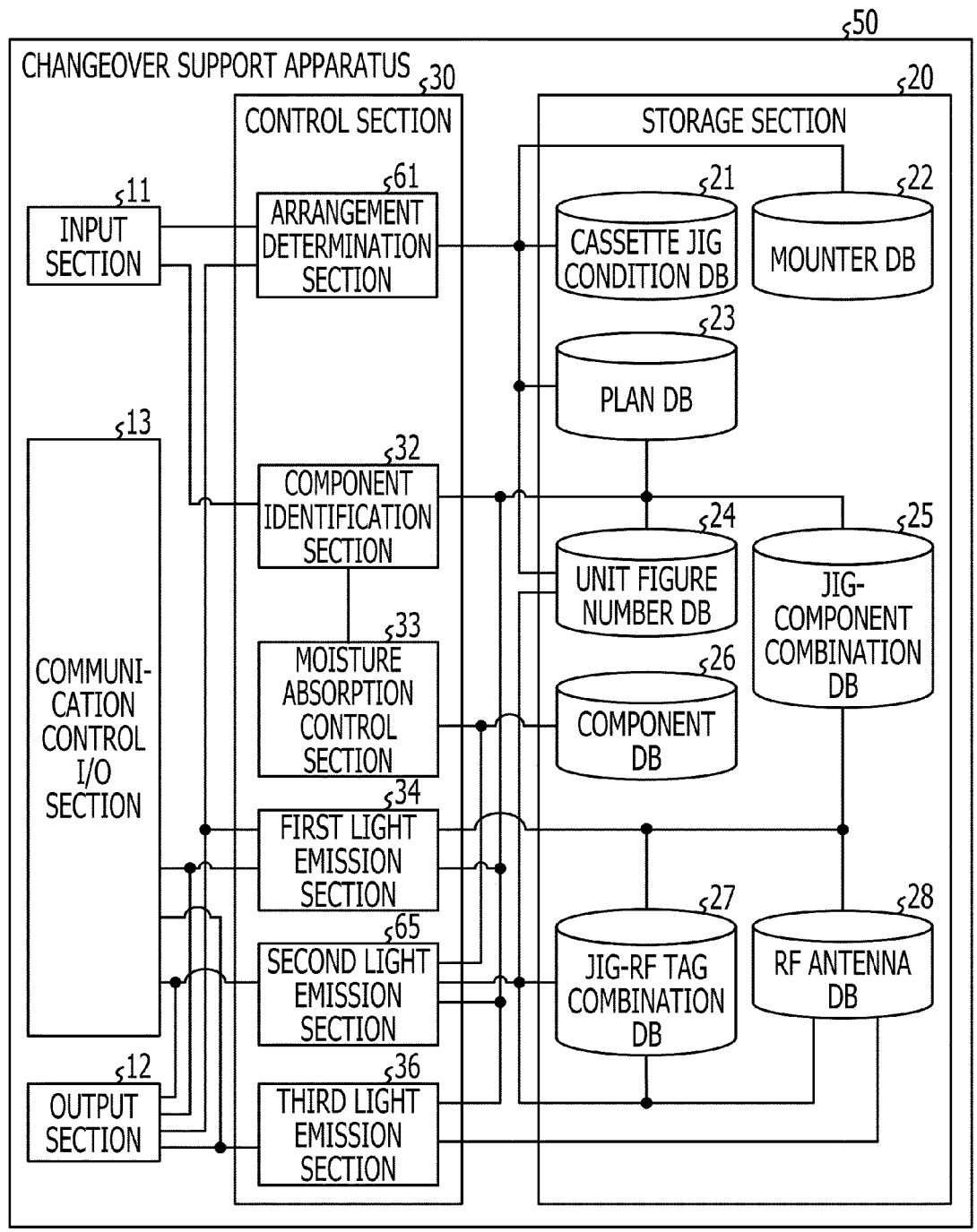
FIG. 15 illustrates a changeover support apparatus according to an embodiment.

A configuration of the changeover support apparatus 50 according to an embodiment is described with reference to FIG. 15. FIG. 15 illustrates the configuration of the changeover support apparatus 50 according to an embodiment. The changeover support apparatus 50 according to an embodiment includes an input section 11, an output section 12, a communication control I/F 13, a storage 20, and a control section 60. Each function section that has a similar function to each of the corresponding sections illustrated in FIG. 2, respectively, is represented by the same number as the number in FIG. 2 and detailed description of the function sections is omitted here.

The management section 60 includes an arrangement determination section 61, a component identification section 32, a moisture absorption management section 33, a first light emission section 34, a second light emission section 65, and a third light emission section 36. The management section 60 may be an integrated circuit such as an ASIC or an FPGA, or an electronic circuit such as a CPU or a MPU. Each function section that has a similar function to each of the corresponding sections illustrated in FIG. 2, respectively, is represented by the same number as the number in FIG. 2 and detailed description of the function sections is omitted here.

The arrangement determination section 61 according to an embodiment additionally includes functions described below in comparison with the arrangement determination section 31 according to an embodiment. When changeover operations for a certain plan may be performed in the fixed arrangement while the same changeover operations for other plans are performed in the fixed arrangement, the arrangement determination section 61 obtains loading points of target components to be used, from unit figure number data of the all set printed circuit board units, and determines whether or not data indicating different types of components are to be loaded on the same loading point exists.

The arrangement determination section 61 determines data indicating different types of components are to be loaded on the same loading point does not exist, the input section 11 is notified that an input condition is allowed. The input section 11 in which the notification is received may accept the selection of components to be removed, from an operator. In addition, the arrangement determination section 61 determines data indicating different types of components are to be loaded on the same loading point exists, the output section 12 is notified that an input condition is not allowed.

When an identifier to identify printed circuit board units are associated with order of loading points and the identifier and the order are stored, the second light emission section 65 identifies a jig to which components to be loaded on loading points are provided, in the order of loading points. In addition, the second light emission section 65 causes a light-emitting element included in the identified jig to emit light in the order of loading points. That is, When the component identification section 32 notifies the second light emission section 65 of a component figure number of electronic components to be loaded on a mounter, the second light emission section 65 identifies a jig to which electronic components to be loaded on the mounter are provided. In addition, the second light emission section 65 transmits a command to an RF tag combined with the identified jig in order of increasing loading point number, and cause an LED to emit light.

The second light emission section 65 extracts a loading point having a smallest number among the component figure numbers identified by the component identification section 32, from the unit figure number DB 24. A case where electronic components are loaded on the "loading point=002" after the "component figure number=P0023" corresponding to the "loading point=001" has been loaded on a mounter is described with reference to the example illustrated in FIG. 6.

The second light emission section 65 extracts the "component figure number=P0008" corresponding to the "loading point=002" from the unit figure number DB 24. After that, the second light emission section 65 obtains a jig ID and a component ID that correspond to the extracted component figure number, from the jig-component combination DB 25. In the example illustrated in FIG. 7, the second light emission section 65 obtains the "jig ID=C1234" and the "component ID=T003983" that correspond to the "component figure number=P0008" from the jig-component combination DB 25.

In addition, the second light emission section 65 obtains an RF tag ID corresponding to the obtained jig ID, from the jig-RF tag combination DB 27. In the example illustrated in FIG. 9, the second light emission section 65 obtains the "RF tag ID=RF0001" corresponding to the "jig ID=C1234" from the jig-RF tag combination DB 27.

In addition, the second light emission section 65 obtains an antenna ID a location of which is "standby space" from the RF antenna DB 28. In addition, the second light emission section 65 transmits a command to the obtained RF tag ID through the obtained antenna ID, thereby causing an LED to emit light. In the example illustrated in FIG. 10, the second light emission section 65 obtains the "antenna ID=ANT 1" a location of which is the "standby space 1" from the RF antenna DB 28 and transmits a command causing the "RF tag ID=RF0001" to emit light, to the obtained "antenna ID=ANT 1".

In addition, when the second light emission section 65 causes the electronic components to emit light, the second light emission section 65 causes the output section 12 to output loading points of a mounter on which electronic components caused to emit light are loaded. In the example illustrated in FIG. 6, the second light emission section 65 associates the "component figure number=P0008" with the "loading point=002" and causes the output section 12 to output the "loading point=002".

In addition, the second light emission section 65 receives a notification indicating whether or not a moisture absorption management time period elapses in electronic components, from the moisture absorption management section 33, and causes the output section 12 to output the received notification. For example, the second light emission section 65 causes the output section 12 to output information in which loading points, component names, and determining whether or not a moisture absorption management time period elapses in the electronic components are associated.

In addition, the second light emission section 65 causes electronic components to emit light in order of increasing loading point number until the second light emission section 65 causes all of the electronic components to be loaded identified by the component identification section 32 to emit light, and repeats processing for causing the output section 12 to output corresponding loading point numbers.

Processing performed in the changeover support apparatus 50 according to an embodiment is described. In the processing performed in the changeover support apparatus 50 according to an embodiment, processing except light emission processing of electronic components to be loaded is similar to the processing performed in the changeover support apparatus 10 according to an embodiment, and the description is omitted here.

Figure 16:
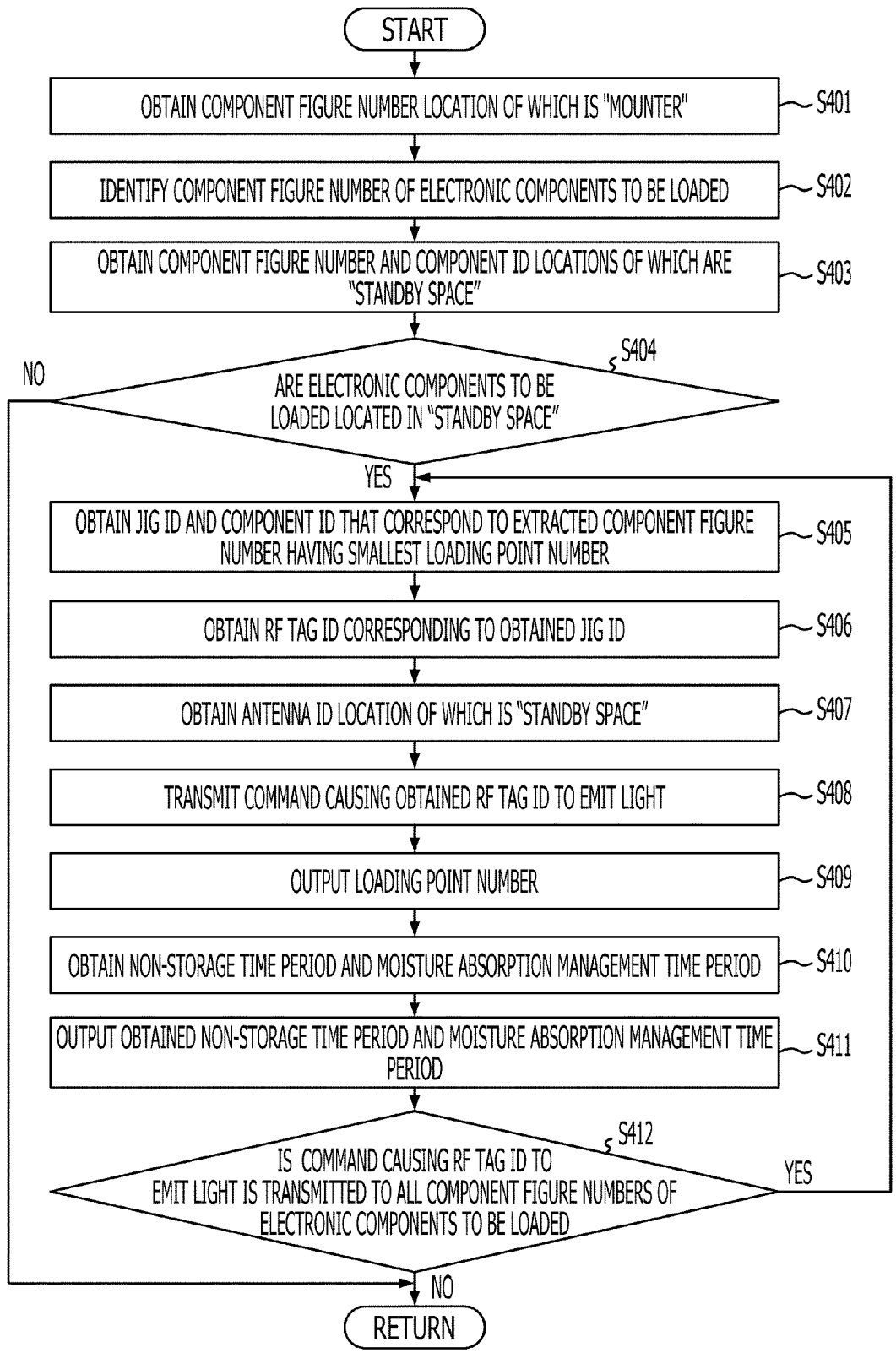
FIG. 16 illustrates a flowchart of light emission processing of electronic components to be loaded, in a changeover support apparatus according to an embodiment.

Procedures of the light emission processing that is for electronic components to be loaded and performed in the changeover support apparatus 50 according to an embodiment are described with reference to FIG. 16. The light emission processing described below corresponds to the processing in Operation S107 illustrated in FIG. 11. Processing from Operation S401 to Operation S404 is similar to the processing from Operation S301 to Operation S304. Thus, the detailed description of the processing from Operation S401 to Operation S404 is omitted and description is provided below for processing in Operation S305 and operations after Operation S305.

The second light emission section 65 extracts a component figure number having a smallest loading point number among the component figure numbers identified in Operation S302, from the unit figure number DB 24, and obtains a jig ID and a component ID that correspond to the extracted component figure number from the jig-component combination DB 25 (Operation S405).

After that, the second light emission section 65 obtains an RF tag ID corresponding to the obtained jig ID from the jig-RF tag combination DB 27 (Operation S406). In addition, the second light emission section 65 obtains an antenna ID a location of which is "standby space", from the RF antenna DB 28 (Operation S407).

The second light emission section 65 transmits a command causing the RF tag ID obtained in Operation S406 to emit light, to the obtained antenna ID (Operation S408). In addition, the second light emission section 65 causes the output section 12 to output a loading point number (Operation S409).

The moisture absorption management section 33 obtains a non-storage time period and a moisture absorption management time period that correspond to the component ID from the component DB 26 (Operation S410). After that, the second light emission section 65 causes the output section 12 to output the non-storage time period and the moisture absorption management time period obtained by the moisture absorption management section 33 (Operation S411). After that, the second light emission section 65 determines whether or not a command causing an RF tag ID to emit light is transmitted to all component figure numbers of electronic components to be loaded identified in Operation S302 (Operation S412). When the second light emission section 65 determines a command causing an RF tag ID to emit light is not transmitted to all of the component figure numbers, the process returns to Operation S405. After that, processing in Operation S405 and operations after Operation S405 is performed. In addition, when the second light emission section 65 determines a command causing an RF tag ID to emit light is transmitted to all of the component figure numbers, the process ends.

In the procedures of the processing performed in the changeover support apparatus 50, the procedures from Operation S407 to Operation S409 may be changed with the procedures from Operation S410 to Operation S411, and may be performed while the procedures from Operation S410 to Operation S411 are performed.

When electronic components are arranged in the fixed arrangement in the changeover support apparatus 50 according to an embodiment, the changeover support apparatus 50 causes RF tags to emit light one by one in order of increasing loading point address number on which electronic components are loaded. As a result, an operator may search electronic components desirably, even when the electronic components are not allocated for each plan or in order of loading.

Figure 17:
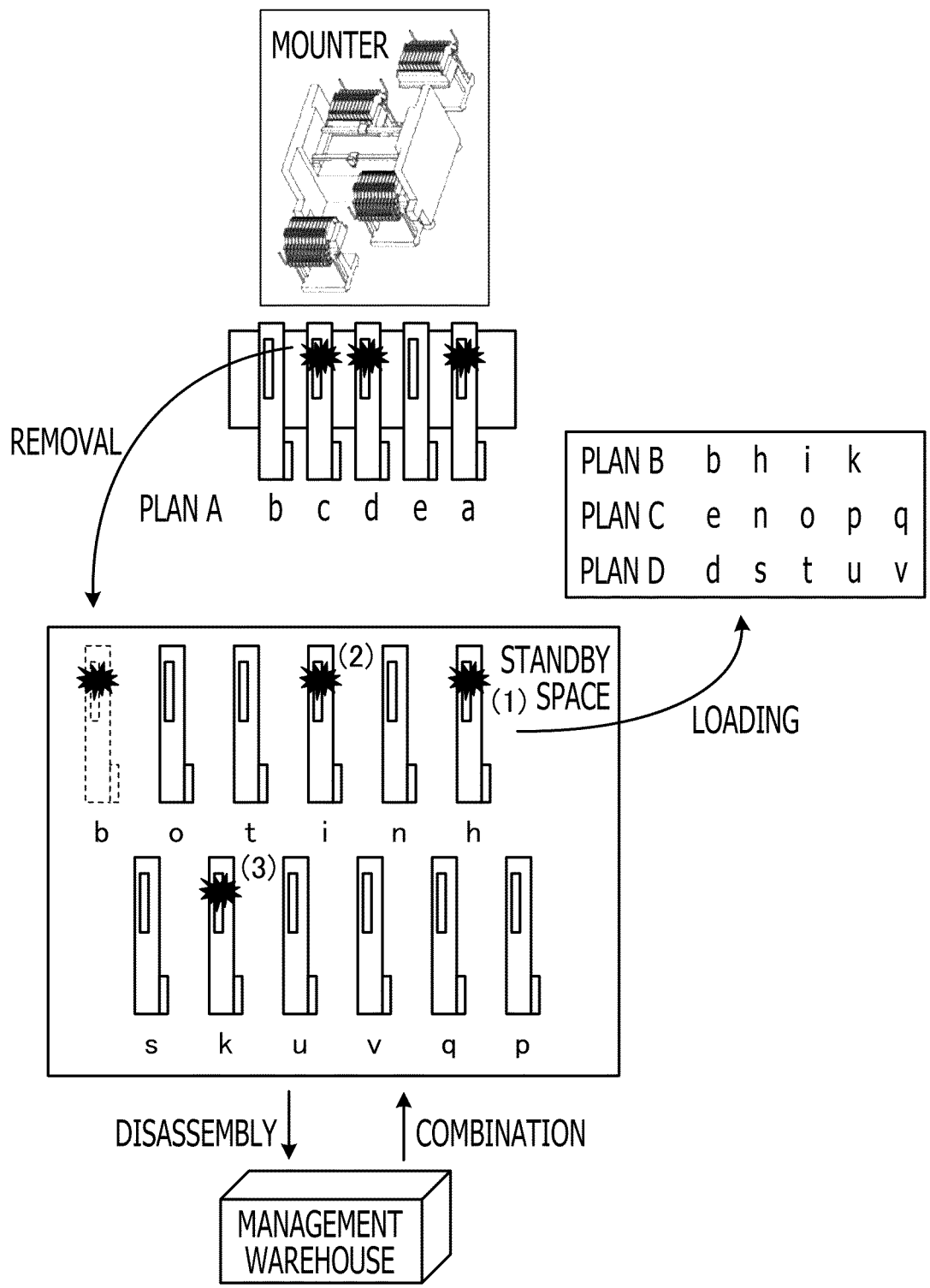
FIG. 17 illustrates a changeover support operation in a changeover support apparatus according to an embodiment.

FIG. 17 illustrates a changeover support operation in the changeover support apparatus 50 according to an embodiment. In the example illustrated in FIG. 17, the changeover support apparatus 50 causes the electronic components "h", "i", and "k" to emit light in order of corresponding loading points. Thus, in the changeover support apparatus 50 according to an embodiment, an operator may not allocate electronic components to be loaded on a mounter in order of loading points, thereby reducing workload desirably. In the changeover support apparatus 50 according to an embodiment, an operator may perform changeover operations desirably without searching electronic components.

Generally, when the optional arrangement is changed into the fixed arrangement in the arrangement for changeover operations, it is difficult to search common components based on loading points because loading points and electronic components are not associated in the optional arrangement. In addition, in the fixed arrangement, loading points and electronic components are associated, thereby increasing workload. Thus, it is difficult to change the arrangement when changeover operations are arranged in the fixed arrangement after changeover operations are arranged in the optional arrangement. However, the changeover support apparatus 50 according to an embodiment, an operator may not search common components because the operator is notified of electronic components to be removed from a mounter. In addition, in the changeover support apparatus 50 according to an embodiment, an operator may not associate loading points and groups of electronic components because the operator is notified of electronic components to be loaded on a mounter in order of loading points. Thus, in the changeover support apparatus 50 according to an embodiment, the optional arrangement may be changed into the fixed arrangement in the arrangement for changeover operations desirably.

A changeover support apparatus may be performed in various embodiments in addition to the above-described embodiments. In an embodiment, a changeover support apparatus according to another embodiment is described.

In an embodiment, the arrangement of electronic components in the optional arrangement is described. In addition, in an embodiment, the arrangement of electronic components in the fixed arrangement is described. However, the changeover support apparatus disclosed herein may not be limited to the embodiments. For example, the arrangement of electronic components may be changed into the optional arrangement after the arrangement of electronic component in the fixed arrangement is performed. In addition, the arrangement of electronic components may be changed into the fixed arrangement after the arrangement of electronic component in the optional arrangement is performed.

In addition, in the changeover support apparatus disclosed herein, when there are two or more cassettes having the same electronic components, set conditions are determined and a cassette that meets the determined conditions may be used. For example, the changeover support apparatus compares the number of electronic components to be used with the number of unused electronic components and determines electronic components that meet set conditions. In this case, the changeover support apparatus multiplies the number of units to be manufactured stored in the plan DB 23 by the number of electronic components to be mounted on a single unit stored in the unit figure number DB 24, and calculates the total number of electronic components to be used.

When the changeover support apparatus is set so that electronic components are provided to a single cassette for each type of electronic components and a cassette having the smallest number of unused electronic components is loaded on a mounter, a lot of types of electronic components may be loaded on the mounter. However, there is a probability of electronic components running out in changeover operations because the number of electronic components provided to the mounter is small.

In addition, when the changeover support apparatus is set so that electronic components are provided to a single cassette for each type of electronic components and a cassette having a smallest difference between the calculated number of electronic components to be used and the number of unused electronic components is loaded on the mounter, a probability of components running out may be reduced and a lot of types of electronic components may be loaded on the mounter.

In addition, when the changeover support apparatus is set so that two or more cassettes having the same type of electronic components are loaded on the mounter and a cassette is used in order of increasing the number of unused components provided to a cassette until the number of unused components exceeds the calculated total number of electronic components to be used, it is difficult to load a lot of types of electronic components on the mounter, however, a probability of components running out may be reduced.

In addition, when the changeover support apparatus is set so that two or more cassettes having the same type of electronic components are loaded on the mounter and a cassette is used in order of decreasing the number of unused components provided to a cassette, a lot of types of electronic components may be loaded on the mounter and a probability of components running out may be reduced.

In addition, as described above, the changeover support apparatus 50 according to an embodiment causes the output section 12 to output a non-storage time period of electronic components in which a moisture absorption management time period elapses, thereby notifying an operator of the output, however, a notification operation may not be limited the above-described notification operation. For example, the changeover support apparatus 50 identifies a jig provided with electronic components in which a moisture absorption management time period elapses, and may regard the identified jig as a jig that is not a target to be changed over without transmitting a command causing an LED of an RF tag combined with the identified jig to emit light. In addition, an operator may set combination of electronic components in which a light emission operation and a blinking operation are performed. In the light emission operation, electronic components in which a moisture absorption management time period elapses are caused to emit light, and in the blinking operation, electronic components in which a moisture absorption management time period does not elapse are caused to blink.

In addition, in the changeover support apparatus, the color of light emitted from LED may vary between electronic components to be removed from a mounter, electronic components to be mounted on the mounter, and electronic components to be disassembled. For example, in the changeover support apparatus, electronic components to be removed from a mounter may emit white light, electronic components to be mounted on the mounter may emit blue light, and electronic components to be disassembled may emit red light.

All or part of the procedures of the processing that is automatically performed from among the procedures of the processing in the above-described embodiments may be manually performed. In addition, all or part of the procedures of the processing that is manually performed from among the procedures of the processing in the above-described embodiments may be performed using a typical method. In addition, the procedures of the processing, the procedures of the controlling, and the specific names that are described above in the embodiments and illustrated in drawings may be altered, unless specified in particular.

In addition, as described above, the changeover support apparatus supports changeover operations for a single mounter, however, the number of mounters for which changeover operations are supported by the changeover support apparatus may not be limited to a single mounter. For example, the changeover support apparatus may support changeover operations for two or more mounters. In this case, in electronic components to be loaded on the mounters, color of an LED caused to emit light or a cycle in which an LED is caused to emit light may be varied for each mounter to be provided with the electronic components, thereby notifying an operator of mounter to be provided with the electronic components and the electronic components.

In addition, information stored in the illustrated storage is a mere example, and the information may not be stored as illustrated. In addition, the various DB included in the storage may be included in a secondary storage device. The secondary storage device may be, for example, a portable physical medium, which is inserted into a changeover support apparatus 10, such as a flexible disk (FD), a compact disc-read-only memory (CD-ROM), a magneto optical (MO) disk, a digital versatile disc (DVD), an optical magnetic disk, and an integrated circuit (IC) card.

In addition, each of the configuration sections illustrated in drawings is based on functional concept, and each of the configuration sections may not be limited to the configurations illustrated in drawings. For example, in the changeover support apparatus 10, the component identification section 32 and the moisture absorption management section 33 may be integrated. In addition, all or part of each processing function performed in each of the devices may be realized in a CPU and a program that is analyzed and executed by the CPU, or all or part of each of the processing functions performed in each of the devices may be implemented as hardware by wired logic.

Various processing in the above-described embodiments may be realized by executing a preliminarily prepared program in a computer system such as a personal computer and a workstation. An example of a computer system in which a program including functions similar to the functions of the above-described embodiments is executed is described below.

Figure 18:
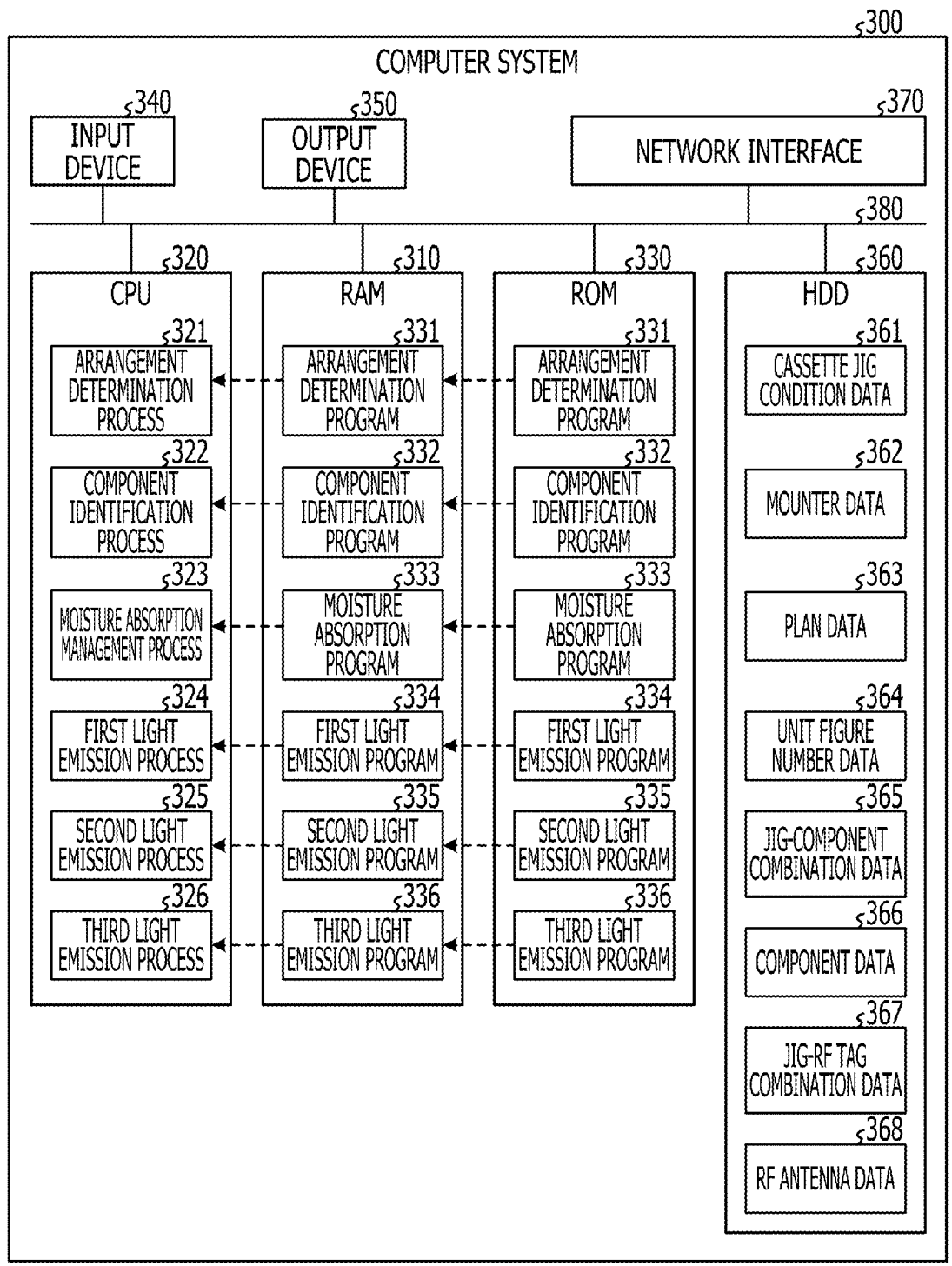
FIG. 18 illustrates a computer system in which a changeover support program is executed.
Figure 19:
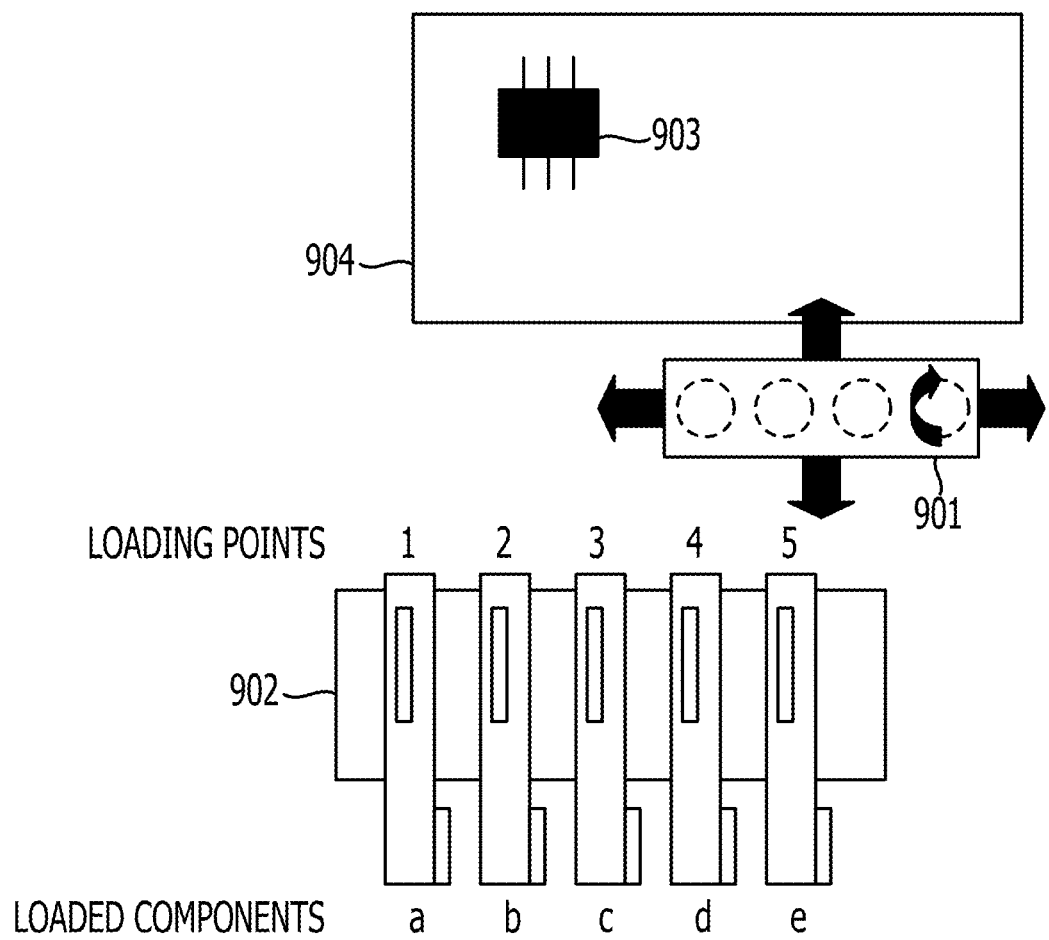
FIG. 19 illustrates processing in which the mounter allocates electronic components to a printed circuit board.

FIG. 18 illustrates a computer system 300 in which a changeover support program is executed. The computer system 300 in illustrated in FIG. 18 includes a RAM 310, a ROM 330, a CPU 320, an input device 340, an output device 350, a Hard Disk Drive (HDD) 360, a network interface 370, and a bus 380. The input device 340 corresponds to the input section 11, and the output device 350 corresponds to the output section 12. In addition, the HDD 360 corresponds to the storage 20, and the network interface 370 corresponds to the communication control I/F 13.

Programs that realize functions described in the embodiments are preliminarily stored in the ROM 330. That is, as illustrated in FIG. 18, an arrangement determination program 331, a component identification program 332, a moisture absorption management program 333, a first light emission program 334, a second light emission program 335, and a third light emission program 336 are preliminarily stored in the ROM 330.

The arrangement determination program 331, the component identification program 332, the moisture absorption management program 333, the first light emission program 334, the second light emission program 335, the third light emission program 336 are read by the CPU 320 and developed to the RAM 310. In addition, the CPU 320 executes the arrangement determination program 331 as an arrangement determination process 321, executes the component identification program 332 as a component identification process 322, and executes the moisture absorption management program 333 as a moisture absorption management process 323. In addition, the CPU 320 executes the first light emission program 334 as a first light emission process 324, executes the second light emission program 335 as a second light emission process 325, and executes the third light emission program 336 as a third light emission process 326.

The arrangement determination process 321 corresponds to the arrangement determination section 31 illustrated in FIG. 2, the component identification process 322 corresponds to the component identification section 32 illustrated in FIG. 2, and the moisture absorption management process 323 corresponds to the moisture absorption management section 33 illustrated in FIG. 2. In addition, the first light emission process 324 corresponds to the first light emission section 34 illustrated in FIG. 2, the second light emission process 325 corresponds to the second light emission section 35 illustrated in FIG. 2, and the third light emission process 326 corresponds to the third light emission section 36 illustrated in FIG. 2.

As illustrated in FIG. 18, the HDD 360 stores cassette jig condition data 361, mounter data 362, plan data 363, and unit figure number data 364. In addition, the HDD 360 stores jig-component combination data 365, component data 366, jig-RF tag combination data 367, and RF antenna data 368.

The cassette jig condition data 361 corresponds to the cassette jig condition DB 21 illustrated in FIG. 2, the mounter data 362 corresponds to the mounter DB 22 illustrated in FIG. 2, and the plan data 363 corresponds to the plan DB 23 illustrated in FIG. 2. In addition, the unit figure number data 364 corresponds to the unit figure number DB 24 illustrated in FIG. 2, the jig-component combination data 365 corresponds to the jig-component combination DB 25 illustrated in FIG. 2, and the component data 366 corresponds to the component DB 26 illustrated in FIG. 2. In addition, the jig-RF tag combination data 367 corresponds to the jig-RF tag combination DB 27 illustrated in FIG. 2, and the RF antenna data 368 corresponds to the RF antenna DB 28 illustrated in FIG. 2.

The above-described programs 331 to 336 may not be stored in the ROM 330. For example, the programs 331 to 336 may be stored in a portable physical medium, which is inserted into the computer system 300, such as an FD, a CD-ROM, an MO disk, a DVD, an optical magnetic disk, and an IC card. In addition, the programs 331 to 336 may be stored in a fixed physical medium, which is installed inside or outside the computer system 300, for example, a hardware disk drive (HDD). In addition, the programs 331 to 336 may be stored in other computer systems coupled to the computer system 300 through a public network, the Internet, a Local Area Network (LAN), a Wide Area Network (WAN), etc. In addition, the computer system 300 may read the programs 331 to 336 from the above-described physical mediums and execute the programs 331 to 336.

That is, the above-described programs 331 to 336 may be computer-readably stored in a recording medium such as a portable physical medium, a fixed physical medium, and a communication medium. In addition, the computer system 300 realizes functions similar to the functions of the above-described embodiments by reading the programs from such recording medium and executing the programs. In addition, the programs 331 to 336 may not be performed by the computer system 300. For example, the above-described embodiments may also be applied to a case where another computer system or a server executes the programs 331 to 336 or a case where another computer system and a server execute the programs 331 to 336 in cooperation.

While specific parts of the computer system are provided herein, any or all of the elements of the parts may be combined to configure a process to execute an operation relative to a disclosed embodiment of present invention.

The embodiments can be implemented in computing hardware (computing apparatus) and/or software, such as (in a non-limiting example) any computer that can store, retrieve, process and/or output data and/or communicate with other computers. The results produced can be displayed on a display of the computing hardware. A program/software implementing the embodiments may be recorded on computer-readable media comprising computer-readable recording media. The program/software implementing the embodiments may also be transmitted over transmission communication media. Examples of the computer-readable recording media include a magnetic recording apparatus, an optical disk, a magneto-optical disk, and/or a semiconductor memory (for example, RAM, ROM, etc.). Examples of the magnetic recording apparatus include a hard disk device (HDD), a flexible disk (FD), and a magnetic tape (MT). Examples of the optical disk include a DVD (Digital Versatile Disc), a DVD-RAM, a CD-ROM (Compact Disc-Read Only Memory), and a CD-R (Recordable)/RW. An example of communication media includes a carrier-wave signal.

All examples and conditional language recited herein are intended for pedagogical purposes to aid the reader in understanding the aspects of the invention and the concepts contributed by the inventor to furthering the art, and are to be construed as being without limitation to such specifically recited examples and conditions, nor does the organization of such examples in the specification relate to a showing of the superiority and inferiority of the aspects of the invention. Although the embodiment in accordance with aspects of the present invention has been described in detail, it should be understood that various changes, substitutions, and alterations could be made hereto without departing from the spirit and scope of the invention, the scope of which is defined in the claims and their equivalents.

What is claimed is:

1. A changeover support apparatus comprising:
    a jig storage that stores an identifier of a component to be mounted on a printed circuit board unit in association with an identifier of a jig on which the component is provided, where a loading point of a component on a mounter is previously unspecified;
    a processor to execute an operation including:
        storing an identifier of a printed circuit board unit in association with the identifier of the component to be mounted on the printed circuit board unit;
        identifying an identifier of a new component to be mounted on a new printed circuit board unit and an identifier of a current component mounted on the printed circuit board unit currently being manufactured when the new component is to be mounted on the new printed circuit board unit by the mounter;
        comparing the identifier of the new component with the identifier of the current component, and identifying a component that is not common with the new component as a candidate component to be removed from the mounter; and
        causing light to be emitted by a light emitting element provided on a jig determined as being occupied by the candidate component when determining a location of the candidate component as being on the mounter, and
    where electronic components determined to be common in the comparing are indicated as candidates to be loaded on the mounter until a number of unused components exceeds a calculated total number of the electronic components to be used.

2. The changeover support apparatus according to claim 1 comprising:
    identifying another new component that is not included in the current component; and
    causing light to be emitted by a light emitting element provided on a jig in which the other new component identified is provided.

3. The changeover support apparatus according to claim 2 further comprising:
    an arrangement storage that stores an identifier of a printed circuit board unit in which a position in the mounter to mount a jig with a certain component is fixed, in association with an order of a position to which the jig is mounted onto, and
    wherein when the identifier of the new printed circuit board unit is stored in the arrangement storage, a second light emitter identifies a jig provided with the components to be mounted onto each position from the jig storage, and causes a light-emitting element provided on the identified jig to emit light in the order of the position of the mounter to which the jig is mounted onto.

4. The changeover support apparatus according to claim 2 further comprising:
    identifying a component to be removed from a jig when manufacture of the printed circuit board unit completes, and
    wherein a light emitter identifies a jig provided with the component identified from the jig storage, and causes light to be emitted via a light-emitting element provided on the identified jig.

5. The changeover support apparatus according to claim 2, wherein a component storage stores an elapsed time indicating time after a component to be mounted on the printed circuit board unit is delivered, in association with the identifier of the printed circuit board unit and the identifier of the component, and
    the light emitter identifies a jig provided with an identified component in which an elapsed time stored in the component storage falls below a certain value from the jig storage, and causes light to be emitted via a light-emitting element provided on the identified jig.

6. The changeover support apparatus according to claim 2, wherein the jig storage stores an identifier of an RF tag attached to a jig, in association with the identifier of the component and the identifier of the jig,
- a light emitter identifies an RF tag attached to the jig provided with the current component from the jig storage, and causes a light-emitting element provided on the identified RF tag to be emitted, and
- another light emitter identifies an RF tag attached to the jig provided with the new component from the jig storage, and causes light to be emitted via a light-emitting element provided on the identified RF tag.

7. A changeover support method comprising:
- identifying, from a component storage that stores an identifier of a printed circuit board unit in association with an identifier of a component to be mounted on the printed circuit board unit, an identifier of a new component to be mounted on a new printed circuit board unit and an identifier of a current component mounted on a printed circuit board unit currently being manufactured when the new printed circuit board unit is manufactured using a mounter, where a loading point of a component on the mounter is previously unspecified;
- comparing the identifier of the new component with the identifier of the current component;
- identifying a component that is not common with the new component as a candidate component to be removed from the mounter;
- identifying, from a jig storage that stores the identifier of the component in association with an identifier of a jig provided with the component, and an identifier of a jig provided with the current component; and
- emitting light via a light-emitting element provided on a jig determined as being occupied by the candidate component when determining a location of the candidate component as being on the mounter, and
- where electronic components determined to be common in the comparing are indicated as candidates to be loaded on the mounter until a number of unused components exceeds a calculated total number of the electronic components to be used.

8. A non-transitory computer-readable medium storing a changeover support program to cause a computer to execute an operation, the operation comprising:
- identifying, a new component to be mounted on new printed circuit board unit to which components are to be mounted, a current component being mounted on a printed circuit board unit currently being manufactured and said identifying being when the new printed circuit board unit is to be manufactured, where a loading point of a component on a mounter is previously unspecified;
- comparing the identified new component with the identified current component;
- identifying a component that is not common with the new component as a candidate component to be removed from a mounter;
- identifying a jig provided with the identified current component; and
- emitting light via a light-emitting element provided on a jig determined as being occupied by the candidate component when determining a location of the candidate component as being on the mounter, and
- where electronic components determined to be common in the comparing are indicated as candidates to be loaded on the mounter until a number of unused components exceeds a calculated total number of the electronic components to be used.

9. A changeover support apparatus comprising:
- a storage configured to store an identifier of a component to be mounted on a printed circuit board unit in association with an identifier of a jig on which the component is provided and an identifier of the printed circuit board unit with the identifier of the component to be mounted on the printed circuit board unit, where a loading point of a component on a mounter is previously unspecified; and
- a processor to execute a procedure including:
    - identifying an identifier of a new component to be mounted on a new printed circuit board unit and an identifier of a current component mounted on a printed circuit board unit currently being manufactured from the storage when the new component is to be mounted on the new printed circuit board unit by the mounter;
    - comparing the identifier of the new component with the identifier of the current component, and identifying a component that is not common with the new component as a candidate component to be removed from the mounter; and
    - causing light to be emitted via a light emitting element provided on a jig determined as being occupied by the candidate component when determining a location of the candidate component as being on the mounter, and
- where electronic components determined to be common in the comparing are indicated as candidates to be loaded on the mounter until a number of unused components exceeds a calculated total number of the electronic components to be used.

* * * * *